(12) United States Patent
Rajski et al.

(10) Patent No.: US 7,493,540 B1
(45) Date of Patent: *Feb. 17, 2009

(54) CONTINUOUS APPLICATION AND DECOMPRESSION OF TEST PATTERNS TO A CIRCUIT-UNDER-TEST

(76) Inventors: Jansuz Rajski, 6502 Horton Rd., West Linn, OR (US) 97068; Jerzy Tyszer, Os. Stare Zegrze 89C/2, 61-249 Poznan (PL); Mark Kassab, 29665 SW. Rose La., Apartment 288, Wilsonville, OR (US) 97070; Nilanjan Mukherjee, 29290 SW. Parkway Ct., Apartment 92, Wilsonville, OR (US) 97070

( * ) Notice: Subject to any disclaimer, the term of this patent is extended or adjusted under 35 U.S.C. 154(b) by 536 days.

This patent is subject to a terminal disclaimer.

(21) Appl. No.: 09/620,021

(22) Filed: Jul. 20, 2000

Related U.S. Application Data

(60) Provisional application No. 60/167,131, filed on Nov. 23, 1999.

(51) Int. Cl.
*G01R 31/28* (2006.01)
(52) U.S. Cl. ...................... 714/733; 714/726
(58) Field of Classification Search ................ 714/729, 714/727, 733, 734, 724, 728, 736, 738, 726
See application file for complete search history.

(56) References Cited

U.S. PATENT DOCUMENTS

| 519,078 | A | 5/1894 | Wilson |
| 713,605 | A | 11/1902 | Churchward |
| 3,614,400 | A | 10/1971 | Farnett |
| 3,700,869 | A | 10/1972 | Low et al. |

(Continued)

FOREIGN PATENT DOCUMENTS

EP 0 108 256 5/1984

(Continued)

OTHER PUBLICATIONS

Rajski et al "Test Data Decompression for Multiple Scan Designs with Boundary Scan" IEEE transactions on computer, vol. 47 No. 11, Nov. 1998.*

(Continued)

*Primary Examiner*—Phung M Chung
(74) *Attorney, Agent, or Firm*—Klarquist Sparkman, LLP

(57) ABSTRACT

A method for applying test patterns to scan chains in a circuit-under-test. The method includes providing a compressed test pattern of bits; decompressing the compressed test pattern into a decompressed test pattern of bits as the compressed test pattern is being provided; and applying the decompressed test pattern to scan chains of the circuit-under-test. The actions of providing the compressed test pattern, decompressing the compressed test pattern, and applying the decompressed pattern are performed synchronously at the same or different clock rates, depending on the way in which the decompressed bits are to be generated. A circuit that performs the decompression includes a decompressor such as a linear finite state machine adapted to receive a compressed test pattern of bits. The decompressor decompresses the test pattern into a decompressed test pattern of bits as the compressed test pattern is being received. The circuit further includes scan chains for testing circuit logic, the scan chains coupled to the decompressor and adapted to receive the decompressed test pattern.

37 Claims, 13 Drawing Sheets

U.S. PATENT DOCUMENTS

| | | | |
|---|---|---|---|
| 4,024,460 A | 5/1977 | Vifian | |
| 4,122,399 A | 10/1978 | Heiter et al. | |
| 4,161,041 A | 7/1979 | Butler et al. | |
| 4,320,509 A | 3/1982 | Davidson | |
| 4,503,537 A | 3/1985 | McAnney | |
| 4,513,418 A | 4/1985 | Bardell, Jr. et al. | |
| 4,536,881 A | 8/1985 | Kasuya | |
| 4,602,210 A | 7/1986 | Fasang et al. | |
| 4,687,988 A | 8/1987 | Eichelberger et al. | |
| 4,754,215 A | 6/1988 | Kawai | |
| 4,785,410 A | 11/1988 | Hamatsu et al. | |
| 4,801,870 A | 1/1989 | Eichelberger et al. | |
| 4,827,476 A | 5/1989 | Garcia | |
| 4,860,236 A | 8/1989 | McLeod et al. | |
| 4,910,735 A | 3/1990 | Yamashita | |
| 4,959,832 A | 9/1990 | Bardell, Jr. | |
| 4,974,184 A | 11/1990 | Avra | |
| 5,072,178 A | 12/1991 | Matsumoto | |
| 5,090,035 A | 2/1992 | Murase | |
| 5,138,619 A | 8/1992 | Fasang et al. | |
| 5,167,034 A * | 11/1992 | MacLean et al. | 714/52 |
| 5,173,906 A | 12/1992 | Dreibelbis et al. | |
| 5,202,889 A | 4/1993 | Aharon et al. | |
| 5,258,986 A | 11/1993 | Zerbe | |
| 5,268,949 A | 12/1993 | Watanabe | |
| 5,293,123 A | 3/1994 | Jordan et al. | |
| 5,301,199 A | 4/1994 | Ikenaga et al. | |
| 5,325,367 A | 6/1994 | Dekker et al. | |
| 5,349,587 A | 9/1994 | Nadeau-Dostie et al. | |
| 5,369,648 A | 11/1994 | Nelson | |
| 5,394,405 A | 2/1995 | Savir | |
| 5,412,665 A | 5/1995 | Gruodis et al. | |
| 5,414,716 A | 5/1995 | Bershteyn | |
| 5,416,783 A | 5/1995 | Broseghini et al. | |
| 5,444,716 A | 8/1995 | Jarwala et al. | |
| 5,446,683 A | 8/1995 | Mullen et al. | |
| 5,450,414 A | 9/1995 | Lin | |
| 5,524,114 A | 6/1996 | Peng | |
| 5,533,128 A | 7/1996 | Vobach | |
| 5,553,082 A | 9/1996 | Connor et al. | |
| 5,574,733 A | 11/1996 | Kim | |
| 5,586,125 A | 12/1996 | Warner | |
| 5,588,006 A | 12/1996 | Nozuyama | |
| 5,592,493 A | 1/1997 | Crouch et al. | |
| 5,608,870 A | 3/1997 | Valiant | |
| 5,612,963 A | 3/1997 | Koenemann et al. | |
| 5,614,838 A | 3/1997 | Jaber et al. | |
| 5,617,531 A | 4/1997 | Crouch et al. | |
| 5,631,913 A | 5/1997 | Maeda | |
| 5,642,362 A | 6/1997 | Savir | |
| 5,668,817 A | 9/1997 | Adham | |
| 5,680,543 A | 10/1997 | Bhawmilk | |
| 5,694,401 A | 12/1997 | Gibson | |
| 5,694,402 A | 12/1997 | Butler et al. | |
| 5,701,308 A | 12/1997 | Attaway et al. | |
| 5,701,309 A | 12/1997 | Gearhardt et al. | |
| 5,717,701 A | 2/1998 | Angelotti et al. | |
| 5,717,702 A | 2/1998 | Stokes et al. | |
| 5,719,913 A | 2/1998 | Maeno | |
| 5,748,497 A | 5/1998 | Scott et al. | |
| 5,761,489 A | 6/1998 | Broseghini et al. | |
| 5,790,562 A | 8/1998 | Murray et al. | |
| 5,790,626 A | 8/1998 | Johnson et al. | |
| 5,812,561 A | 9/1998 | Giles et al. | |
| 5,831,992 A | 11/1998 | Wu | |
| 5,848,198 A | 12/1998 | Penn | |
| 5,867,507 A | 2/1999 | Beebe et al. | |
| 5,870,476 A | 2/1999 | Fischer | |
| 5,872,793 A | 2/1999 | Attaway et al. | |
| 5,883,906 A | 3/1999 | Turnquist et al. | |
| 5,899,961 A | 5/1999 | Sundermann | |
| 5,905,986 A | 5/1999 | Rohrbaugh et al. | |
| 5,938,784 A | 8/1999 | Kim | |
| 5,968,194 A | 10/1999 | Wu et al. | |
| 5,974,179 A * | 10/1999 | Caklovic | 382/232 |
| 5,974,433 A | 10/1999 | Currie | |
| 5,983,380 A | 11/1999 | Motika et al. | |
| 5,991,898 A | 11/1999 | Rajski et al. | |
| 5,991,909 A | 11/1999 | Rajski et al. | |
| 6,006,349 A | 12/1999 | Fujisaki | |
| 6,014,763 A | 1/2000 | Dhong et al. | |
| 6,026,508 A * | 2/2000 | Craft | 714/819 |
| 6,029,263 A | 2/2000 | Gibson | |
| 6,041,429 A | 3/2000 | Koenemann | |
| 6,055,658 A | 4/2000 | Jaber et al. | |
| 6,061,818 A | 5/2000 | Touba et al. | |
| 6,072,823 A | 6/2000 | Takakusaki | |
| 6,100,716 A | 8/2000 | Adham et al. | |
| 6,122,761 A | 9/2000 | Park | |
| 6,141,669 A | 10/2000 | Carleton | |
| 6,158,032 A | 12/2000 | Currier et al. | |
| 6,178,532 B1 | 1/2001 | Pierce et al. | |
| 6,181,164 B1 | 1/2001 | Miller | |
| 6,199,182 B1 | 3/2001 | Whetsel | |
| 6,240,432 B1 | 5/2001 | Chuang et al. | |
| 6,256,759 B1 | 7/2001 | Bhawmik | |
| 6,256,760 B1 | 7/2001 | Carron et al. | |
| 6,272,653 B1 | 8/2001 | Amstutz | |
| 6,286,119 B1 | 9/2001 | Wu et al. | |
| 6,300,885 B1 | 10/2001 | Davenport et al. | |
| 6,308,291 B1 | 10/2001 | Kock et al. | |
| 6,327,687 B1 * | 12/2001 | Rajski et al. | 714/738 |
| 6,330,681 B1 | 12/2001 | Cote et al. | |
| 6,353,842 B1 | 3/2002 | Rajski et al. | |
| 6,385,750 B1 | 5/2002 | Kapur et al. | |
| 6,463,560 B1 | 10/2002 | Bhawmik et al. | |
| 6,467,058 B1 | 10/2002 | Chakradhar et al. | |
| 6,539,409 B2 | 3/2003 | Rajski et al. | |
| 6,543,020 B2 * | 4/2003 | Rajski et al. | 714/738 |
| 6,557,129 B1 | 4/2003 | Rajski et al. | |
| 6,590,929 B1 | 7/2003 | Williams | |
| 6,611,933 B1 | 8/2003 | Koenemann et al. | |
| 6,684,358 B1 | 1/2004 | Rajski et al. | |
| 6,708,192 B2 | 3/2004 | Rajski et al. | |
| 6,763,488 B2 | 7/2004 | Whetsel | |
| 6,829,740 B2 | 12/2004 | Rajski et al. | |
| 6,874,109 B1 | 3/2005 | Rajski et al. | |
| 7,001,461 B2 | 2/2006 | Taniguchi et al. | |
| 7,093,175 B2 | 8/2006 | Rajski et al. | |
| 7,111,209 B2 | 9/2006 | Rajski et al. | |
| 7,260,591 B2 | 8/2007 | Rajski et al. | |
| 7,263,641 B2 | 8/2007 | Rajski et al. | |
| 2002/0112199 A1 | 8/2002 | Whetsel | |
| 2002/0124217 A1 | 9/2002 | Hiraide et al. | |
| 2003/0120988 A1 | 6/2003 | Rajski et al. | |
| 2003/0131298 A1 * | 7/2003 | Rajski et al. | 714/738 |
| 2004/0128599 A1 | 7/2004 | Rajski et al. | |
| 2004/0172431 A1 | 9/2004 | Rajski et al. | |
| 2005/0015688 A1 | 1/2005 | Rajski et al. | |
| 2005/0097419 A1 | 5/2005 | Rajski et al. | |

FOREIGN PATENT DOCUMENTS

| | | |
|---|---|---|
| EP | 0372226 | 6/1990 |
| EP | 0438322 | 7/1991 |
| EP | 0481097 | 4/1992 |
| EP | 0 549 949 | 3/1998 |
| EP | 0887930 | 12/1998 |
| EP | 1 242 885 | 9/2002 |
| EP | 1 256 007 | 6/2008 |
| JP | 63-286780 | 11/1988 |
| JP | 01-239486 | 9/1989 |
| JP | 03-002579 | 1/1991 |
| JP | 03-012573 | 1/1991 |

| | | |
|---|---|---|
| JP | 4-236378 | 8/1992 |
| JP | 05-215816 | 8/1993 |
| JP | 05-249197 | 9/1993 |
| JP | 07-174822 | 7/1995 |
| JP | 07-198791 | 8/1995 |
| JP | 08-015382 | 1/1996 |
| JP | 9-130378 | 5/1997 |
| JP | 11-030646 | 2/1999 |
| JP | 11-153655 | 6/1999 |
| JP | 11-174126 | 7/1999 |
| JP | 11-2644860 | 9/1999 |
| JP | 2003-526778 | 9/2003 |
| JP | 3845016 | 8/2006 |
| WO | WO 91/10182 | 7/1991 |
| WO | WO 01/38889 | 5/2001 |
| WO | WO 01/38890 | 5/2001 |
| WO | WO 01/38891 | 5/2001 |
| WO | WO 01/38955 | 5/2001 |
| WO | WO 01/38981 | 5/2001 |
| WO | WO 01/39254 | 5/2001 |

OTHER PUBLICATIONS

J. Rajski, J. Tyszer, N. Zacharia, "Test Data Decompression for Multiple Scan Designs with Boundary Scan," IEEE Transactions on Computers, vol. 47, No. 11, Nov. 1998.

J. Rajski and J. Tyszer, "Design of Phase Shifters for BIST Applications", *Proc. VLSI Test Symposium*, pp. 218-224, 1998.

J. Rajski, N. Tamarapalli, J. Tyszer, "Automated Synthesis of Large Phase Shifters for Built-In-Self-Test," International Test Conference, Paper 41.1, p. 1047-1056, IEEE 1998.

Venkataraman, Rajski, Hellebrand, and Tarnick, "An Efficient BIST Scheme Based on Reseeding of Multiple Polynomial Linear Feedback Shift Registers", pp. 572-577, 1993 IEEE.

P.H. Bardell, "Design Considerations for Parallel Pseudorandom Pattern Generators", Journal of Electronic Testing: Theory and Applications, 1,73-87 (1990).

I. Hamzaoglu, J. Patel, "Reducing Test Application Time for Full Scan Embedded Cores," Center for Reliable & High-Performance Computing, University of Illinois, Urbana, IL., 1999 IEEE.

S. Hellebrand, J. Rajski, S. Tarnick, S. Venkataraman, B. Courtois, "Built-in Test for Circuits With Scan Based on Reseeding of Multiple Polynominal Linear Feedback Shift Registers", *IEEE Trans. On Computers*, vol. C-44, pp. 223-233, 1995.

S. Hellebrand, B. Reeb, S. Tarnick, H-J Wunderlich, "Pattern Generation for a Deterministic BIST Scheme", pp. 88-941995 IEEE.

B. Koenemann c/o IBM Corp., B56/901, "LFSR-Coded Test Patterns for Scan Designs", *Proceedings of European Test Conference*, pp. 273-242, 1991.

Bershteyn, M., "Calculation of Multiple Sets of Weights for Weighted Random Testing," International Test Conference 1993, Paper 45.3, p. 1031-1040.

Zacharia, N. et al., "Decompression of Test Data Using Variable-Length Seed LFSRs," IEEE 1995, 426-433.

Mano, M. Morris, "Computer System Architectures," 2nd Edition, Prentice-Hall, Inc., New Jersey, 1982.

P.H. Bardell, W.H. McAnney, J. Savir, Built in test for VLSI: Pseudorandom Techniques, John Wiley & Sons, 1987.

W.B. Jone and S.R. Das, "Space compression method for built-in self testing of VLSI circuits," *Int. Journal of Computer Aided VLSI Design*, vol. 3, pp. 309-322, 1991.

H.J. Wunderlich, "On computing optimized input probabilities for random tests," Proc. DAC pp. 392-398, 1987.

N.R. Saxena and J.P. Robinson, "Accumulator compression testing," *IEEE Trans. Comput.*, vol. C-35, No. 4, pp. 317-321, 1986.

J.P. Hayes, "Check sum test methods," *Proc. FTCS*, pp. 114-120, 1976.

J. Savir, "Syndrome-testable design of combinational circuits," *IEEE Trans. Comput.* vol. C-29, No. 6, pp. 442-451, 1980.

Y.K. Li and J.P. Robinson, "Space compression methods with output data modification," *IEEE Trans. CAD if Integrated Circuits and Systems*, vol. CAD-6, No. 2, pp. 290-294, 1987.

J.E. Smith, "Measures of the effectiveness of fault signature analysis," *IEEE Trans. Comput.*, vol. C-29, No. 6, pp. 510-514, 1980.

K.J. Latawiec, "New method of generation of shifted linear pseudo-random binary sequences", *Proc. IEE*, vol. 121, No. 8, pp. 905-906, 1974.

N.R. Saxena and E.J. McCluskey, "Extended precision checksums," *Proc. FTCS*, pp. 142-147, 1987.

J.P. Hayes, "Transition count testing of combinational logic circuits," *IEEE Trans. Comput.*, vol. C-25, No. 6, pp. 613-620, 1976.

P.H. Bardell and W.H. McAnney, "Pseudorandom arrays for built-in tests," ISSS Trans. Comput., vol. C-35, No. 7, pp. 653-658, 1986.

B. Ireland and J.E. Marshall, "Matrix method to determine shaft-register connections for delayed pseudorandom binary sequences," *Electronics Letters*, vol. 4 No. 15, pp. 309-310, 1968.

J.A. Waicukauski, E. Lindbloom, E.B. Eichelberger and O.P. Forlenza, "A method for generating weighted random test patterns," *IBM J. Res. Develop.*, vol. 33, No. 2, pp. 149-161, Mar. 1989.

R.A. Frohwerk, "Signature analysis: a new digital field services method," *Hewlett-Packard Journal*, pp. 2-8, May 1997.

G. Hetherington, T. Fryars, N. Tamarapalli, M. Kassab, A. Hasson and J. Rajski, "Logic BIST for Large Industrial Designs: Real Issues and Case Studies," *Proc. ITC*, pp. 358-367, 1999.

V. Iyengar, K. Chakrabarty and B.T. Murry, "Built-In Slf-testing of sequential circuits using precomputed test sets," *Proc. VLSI Test Symposium*, pp. 418-423, 1998.

A. Jas, J. Ghosh-Dastidar and N.A. Touba, "Scan vector compression/decompression using statistical coding," Proc. VLSI Test Symposium, pp. 114-120, 1999.

A.Jas and N.A. Touba, "Test vector decompression via cyclical scan chains and its application to testing core-based designs," Proc. ITC, pp. 458-464, 1998.

M. Serra, T. Slater, J.C. Muzio and D.M. Miller, "The analysis of one-dimensional linear cellular automata and their aliasing properties," *IEEE Trans. CAD of Integrated Circuits and Systems*, vol. CAD-9, No. 7, pp. 767-778, 1990.

T.W. Williams, W. Daehn, M. Gruetzner and C.W. Starke, "Bounds and analysis of aliasing errors in linear-feedback shift registers," *IEEE Trans. CAD of Integrated Circuits and Systems*, vol. CAD-7, No. 1, pp. 75-83, 1988.

M. Ishida, D.S. Ha and T. Yamaguchi, "COMPACT: A hybrid method for compression test data," *Proc. VLSI Test Symposium*, pp. 62-69, 1998.

K. Kim, D.S. Ha and J.G. Tront, "On using signature registers as pseudorandon pattern generators in built-in self testing," *IEEE Trans. CAD of IC*, vol. CAD-7, No. 8, 1988, pp. 919-928.

G. Mrugalski, J. Rajski and J. Tyszer, "Synthesis of pattern generators based on cellular automata with phase shifters," Proc. Int. Test Conf., pp. 368-377, 1999.

R. Kapur, S. Patil, T.J. Snethen and T.W. Williams, "Design of an efficient weighted random pattern generation system," *Proc. ITC.*, pp. 491-500, 1994.

F. Muradali, V.K. Agarwal and B. Nadeau-Dostie, "A new procedure for weighted random built-in self-test," *Proc. ITC.*, pp. 600-669, 1990.

S. Pateras and J. Rajski, "Cube contained random patterns and their application to the complete testing of synthesized multi-level circuits," *Proc. ITC.*, pp. 473-482, 1991.

J. Rajski and J. Tyszer, "Test responses compaction in accumulators with rotate carry adders," *IEEE Transactions CAD of Integrated Circuits and Systems*, vol. CAD-12, No. 4, pp. 531-539, 1993.

J. Rajski and J. Tyszer, "Accumulator-based compaction of test responses," *IEEE Transactions on Comput.*, vol. C-42, No. 6, pp. 643-650, 1993.

N.R. Saxena and E.J. McCluskey, "Analysis of checksums, extended-precision checksums, and cyclic redundancy," *IEEE Trans. Comput.*, vol. C-39, No. 7, pp. 969-975, 1990.

N.A. Touba and E.J. McCluskey, "Transformed pseudo-random patterns for BIST," *Proc. VLSI Test Symposium*, pp. 410-416, 1995.

N.A. Touba and E.J. McCluskey, "Altering a pseudo-random bit sequence for scan-based BIST," Proc. ITC., pp. 167-175, 1996.

K.H. Tsai, S. Hellbrand, J. Rajski and Marek-Sadowska, "STARBIST: Scan autocorrelated random pattern generation," *Proc. DAC*, pp. 472-477, 1997.

H.J. Wunderlich and G. Kiefer, "Bit-flipping BIST," Proc. ICCAD, pp. 337-343, 1996.

S.W. Golomb, Shift Register Sequences, Holden Day, San Francisco, 1967.

V.N. Yarmolik and S.N. Demidenko, Generation and Application of Pseudorandom Sequences for Random Testing, J. Wiley & Sons, New York, 1988.

Langdon, Jr., "An Introduction to Arithmetic Coding," IBM J. Res. Develop., vol. 28, No. 2, pp. 135-149 (Mar. 1984).

Bassett et al., "Low-Cost Testing of High-Density Logic Components," IEEE Design & Test of Computers, pp. 15-28 (Apr. 1990).

Fagot et al., "On Calculating Efficient LFSR Seeds for Built-In Self Test," IEEE, pp. 7-14 (1999).

Hellebrand et al., "Generation of Vector Patterns Through Reseeding of Multiple-Polynomial Linear Feedback Shift Registers," IEEE International Test Conference, pp. 120-129 (1992).

Wang, "BIST Using Pseudorandom Test Vectors and Signature Analysis," IEEE Custom Integrated Circuits Conference, pp. 1611-1618 (1998).

Lew Yan Voon et al., "BIST Linear Generator based on Complemented Outputs," IEEE VLSI Test Symp., pp. 137-142 (1992).

Zacharia et al., "Two-Dimensional Test Data Decompressor for Multiple Scan Designs," International Test Conference, pp. 186-194 (1996).

Aitken et al., "A Diagnosis Method Using Pseudo-Random Vectors Without Intermediate Signatures," Proc. ICCAD, pp. 574-577 (1989).

Bardell et al., Built-In Test for VLSI Pseudorandom Techniques, Chapter 4, "Test Response Compression Techniques," John Wiley & Sons, Inc., pp. 89-108, (1987).

Benowitz et al., "An Advanced Fault Isolation System for Digital Logic," IEEE Transactions on Computers, vol. C-24, No. 5, pp. 489-497 (May 1975).

Chakrabarty et al., "Optimal Zero-Aliasing Space Compaction of Test Responses," IEEE Transactions on Computers, vol. 47, No. 11, pp. 1171-1187 (Nov. 1998).

Chakrabarty, "Zero-Aliasing Space Compaction Using Linear Compactors with Bounded Overhead," IEEE Transactions on Computer-Aided Design of Integrated Circuits and Systems, vol. 17, No. 5, pp. 452-457 (May 1998).

Ghosh-Dastidar et al., "Fault Diagnosis in Scan-Based BIST Using Both Time and Space Information," Proc. ITC, pp. 95-102 (Sep. 1999).

Karpovsky et al., "Board-Level Diagnosis by Signature Analysis," Proc. ITC, pp. 47-53 (1988).

Karpovsky et al., "Design of Self-Diagnostic Boards by Multiple Signature Analysis," IEEE Transactions on Computers, vol. 42, No. 9, pp. 1035-1044 (Sep. 1993).

Kundu, "On Diagnosis of Faults in a Scan-Chain," Proc. VLSI Test Symp., pp. 303-308 (1993).

Narayanan et al., "An Efficient Scheme to Diagnose Scan Chains," Proc. ITC, pp. 704-713 (1997).

Rajski et al., Arithmetic Built-In Self-Test for Embedded Systems, Chapter 3, "Test Response Compaction," and Chapter 4, "Fault Diagnosis," Prentice Hall PTR, pp. 87-133 (1998).

Rajski et al., "Diagnosis of Scan Cells in BIST Environment," IEEE Transactions on Computers, vol. 48, No. 7, pp. 724-731 (Jul. 1999).

Saluja et al., "Testing Computer Hardware through Data Compression in Space and Time" Proc. ITC, pp. 83-88 (1983).

Wu et al., "Scan-Based BIST Fault Diagnosis," IEEE Transactions on Computer-Aided Design of Integrated Circuits and Systems, vol. 18, No. 2, pp. 203-211 (Feb. 1999).

Chakrabarty et al., "Optimal Space Compaction of Test Responses," Proc. ITC, pp. 834-843 (1995).

Chakrabarty et al., "Test Response Compaction Using Multiplexed Parity Trees," IEEE Trans. CAD, vol. CAD-15, No. 11, pp. 1399-1408 (1996).

European Search Report dated Nov. 15, 2004, from European Application No. EP 00 99 1744.

European Communication dated Mar. 17, 2005, from European Application No. EP 00 99 1744.

European Communication dated Feb. 13, 2006, from European Application No. EP 00 99 1744.

European Communication dated Apr. 23, 2007, from European Application No. EP 00 99 1744.

European Communication dated Mar. 14, 2008, from European Application No. EP 00 99 1744.

International Preliminary Examination Report from International Application No. PCT/US00/42211 (international Publication No. WO 01/39254).

International Search Report from International Application No. PCT/US00/42211 (International Publication No. WO 01/39254).

Ivanov et al., "Programmable BIST Space Compactors," IEEE Trans. Computers, vol. 45, No. 12, pp. 1393-1404 (1996).

Japanese Notice of Rejection dated Mar. 24, 2005, including an English-language translation, from Japanese Patent Application No. 2001-540825.

Konemann et al., "Built-In Logic Block Observation Techniques," IEEE Test Conference, 6 pp. (1979).

Pouya et al., "Synthesis of Zero-Aliasing Elementary-Tree Space Compactors," Proc. VLSI Test Symp., pp. 70-77 (1998).

Reddy et al., "A Data Compression Technique for Built-In Self-Test," IEEE Trans. Computers, vol. 37, No. 9, pp. 1151-1156 (1998).

Written Opinion from International Application No. PCT/US00/4221 (international Publication No. WO 01/39254).

Wunderlich, "Multiple Distributions for Biased Random Test Patterns," Proc. ITC, pp. 236-244 (1988).

Yamaguchi et al., "An Efficient Method for Compressing Test Data," Proc. ITC, pp. 79-88 (1997).

* cited by examiner

Scan chain 0
$a_2 \oplus a_4 \oplus a_5$
$a_4 \oplus a_6 \oplus a_7$
$a_1 \oplus a_6 \oplus a_8 \oplus a_9$
$a_1 \oplus a_3 \oplus a_8 \oplus a_{10} \oplus a_{11}$
$a_3 \oplus a_5 \oplus a_{10} \oplus a_{12} \oplus a_{13}$
$a_0 \oplus a_1 \oplus a_4 \oplus a_5 \oplus a_8 \oplus a_9 \oplus a_{11} \oplus a_{12} \oplus a_{13} \oplus a_{16}$
$a_0 \oplus a_2 \oplus a_7 \oplus a_9 \oplus a_{14} \oplus a_{16} \oplus a_{17}$
$a_0 \oplus a_2 \oplus a_4 \oplus a_9 \oplus a_{11} \oplus a_{16} \oplus a_{18} \oplus a_{19}$ Scan chain 1
$a_1 \oplus a_2 \oplus a_3 \oplus a_6$
$a_0 \oplus a_1 \oplus a_3 \oplus a_4 \oplus a_5 \oplus a_8$
$a_2 \oplus a_3 \oplus a_5 \oplus a_6 \oplus a_7 \oplus a_{10}$
$a_0 \oplus a_1 \oplus a_4 \oplus a_5 \oplus a_7 \oplus a_8 \oplus a_9 \oplus a_{12}$
$a_2 \oplus a_3 \oplus a_6 \oplus a_7 \oplus a_9 \oplus a_{10} \oplus a_{11} \oplus a_{14}$
$a_0 \oplus a_5 \oplus a_7 \oplus a_{12} \oplus a_{14} \oplus a_{15}$
$a_0 \oplus a_2 \oplus a_3 \oplus a_6 \oplus a_7 \oplus a_{10} \oplus a_{11} \oplus a_{13} \oplus a_{14} \oplus a_{15} \oplus a_{18}$
$a_0 \oplus a_1 \oplus a_2 \oplus a_4 \oplus a_5 \oplus a_8 \oplus a_9 \oplus a_{12} \oplus a_{13} \oplus a_{15} \oplus a_{16} \oplus a_{17} \oplus a_{20}$ Scan chain 2
$a_3$
$a_0 \oplus a_5$
$a_2 \oplus a_7$
$a_0 \oplus a_4 \oplus a_9$
$a_2 \oplus a_6 \oplus a_{11}$
$a_0 \oplus a_1 \oplus a_4 \oplus a_8 \oplus a_{13}$
$a_0 \oplus a_2 \oplus a_3 \oplus a_6 \oplus a_{10} \oplus a_{15}$
$a_1 \oplus a_2 \oplus a_4 \oplus a_5 \oplus a_8 \oplus a_{12} \oplus a_{17}$ Scan chain 3
$a_0 \oplus a_1 \oplus a_5 \oplus a_7$
$a_2 \oplus a_3 \oplus a_7 \oplus a_9$
$a_4 \oplus a_5 \oplus a_9 \oplus a_{11}$
$a_6 \oplus a_7 \oplus a_{11} \oplus a_{13}$
$a_1 \oplus a_8 \oplus a_9 \oplus a_{13} \oplus a_{15}$
$a_0 \oplus a_3 \oplus a_{10} \oplus a_{11} \oplus a_{15} \oplus a_{17}$
$a_0 \oplus a_2 \oplus a_5 \oplus a_{12} \oplus a_{13} \oplus a_{17} \oplus a_{19}$
$a_2 \oplus a_4 \oplus a_7 \oplus a_{14} \oplus a_{15} \oplus a_{19} \oplus a_{21}$ Scan chain 4
$a_0 \oplus a_4 \oplus a_7$
$a_0 \oplus a_2 \oplus a_6 \oplus a_9$
$a_0 \oplus a_1 \oplus a_2 \oplus a_4 \oplus a_8 \oplus a_{11}$
$a_0 \oplus a_2 \oplus a_3 \oplus a_4 \oplus a_6 \oplus a_{10} \oplus a_{13}$
$a_1 \oplus a_2 \oplus a_4 \oplus a_5 \oplus a_6 \oplus a_8 \oplus a_{12} \oplus a_{15}$
$a_1 \oplus a_3 \oplus a_4 \oplus a_6 \oplus a_7 \oplus a_8 \oplus a_{10} \oplus a_{14} \oplus a_{17}$
$a_1 \oplus a_3 \oplus a_5 \oplus a_6 \oplus a_8 \oplus a_9 \oplus a_{10} \oplus a_{12} \oplus a_{16} \oplus a_{19}$
$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21}$ Scan chain 5
$a_0 \oplus a_5 \oplus a_6$
$a_0 \oplus a_1 \oplus a_2 \oplus a_7 \oplus a_8$
$a_2 \oplus a_3 \oplus a_4 \oplus a_9 \oplus a_{10}$
$a_0 \oplus a_4 \oplus a_5 \oplus a_6 \oplus a_{11} \oplus a_{12}$
$a_0 \oplus a_1 \oplus a_2 \oplus a_6 \oplus a_7 \oplus a_8 \oplus a_{13} \oplus a_{14}$
$a_0 \oplus a_1 \oplus a_2 \oplus a_3 \oplus a_4 \oplus a_8 \oplus a_9 \oplus a_{10} \oplus a_{15} \oplus a_{16}$
$a_2 \oplus a_3 \oplus a_4 \oplus a_5 \oplus a_6 \oplus a_{10} \oplus a_{11} \oplus a_{12} \oplus a_{17} \oplus a_{18}$
$a_1 \oplus a_4 \oplus a_5 \oplus a_6 \oplus a_7 \oplus a_8 \oplus a_{12} \oplus a_{13} \oplus a_{14} \oplus a_{19} \oplus a_{20}$ Scan chain 6
$a_0 \oplus a_1 \oplus a_2 \oplus a_6$
$a_1 \oplus a_2 \oplus a_3 \oplus a_4 \oplus a_8$
$a_3 \oplus a_4 \oplus a_5 \oplus a_6 \oplus a_{10}$
$a_1 \oplus a_5 \oplus a_6 \oplus a_7 \oplus a_8 \oplus a_{12}$
$a_0 \oplus a_1 \oplus a_3 \oplus a_7 \oplus a_8 \oplus a_9 \oplus a_{10} \oplus a_{14}$
$a_0 \oplus a_2 \oplus a_3 \oplus a_5 \oplus a_9 \oplus a_{10} \oplus a_{11} \oplus a_{12} \oplus a_{16}$
$a_0 \oplus a_2 \oplus a_4 \oplus a_5 \oplus a_7 \oplus a_{11} \oplus a_{12} \oplus a_{13} \oplus a_{14} \oplus a_{18}$
$a_0 \oplus a_2 \oplus a_4 \oplus a_6 \oplus a_7 \oplus a_9 \oplus a_{13} \oplus a_{14} \oplus a_{15} \oplus a_{16} \oplus a_{20}$ Scan chain 7
$a_2 \oplus a_3 \oplus a_5$
$a_0 \oplus a_4 \oplus a_5 \oplus a_7$
$a_0 \oplus a_2 \oplus a_6 \oplus a_7 \oplus a_9$
$a_1 \oplus a_2 \oplus a_4 \oplus a_8 \oplus a_9 \oplus a_{11}$
$a_0 \oplus a_3 \oplus a_4 \oplus a_6 \oplus a_{10} \oplus a_{11} \oplus a_{13}$
$a_1 \oplus a_2 \oplus a_5 \oplus a_6 \oplus a_8 \oplus a_{12} \oplus a_{13} \oplus a_{15}$
$a_1 \oplus a_3 \oplus a_4 \oplus a_7 \oplus a_8 \oplus a_{10} \oplus a_{14} \oplus a_{15} \oplus a_{17}$
$a_0 \oplus a_3 \oplus a_5 \oplus a_6 \oplus a_9 \oplus a_{10} \oplus a_{12} \oplus a_{16} \oplus a_{17} \oplus a_{19}$

FIG. 7

CONTINUOUS APPLICATION AND DECOMPRESSION OF TEST PATTERNS TO A CIRCUIT-UNDER-TEST

RELATED APPLICATION DATA

This application claims the benefit of U.S. Provisional Application No. 60/167,131, filed Nov. 23, 1999, which is hereby incorporated by reference.

TECHNICAL FIELD

This invention relates generally to testing of integrated circuits and, more particularly, to the generation and application of test data in the form of patterns, or vectors, to scan chains within a circuit-under-test.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational network. The most-often used DFT methodology is based on scan chains. It assumes that during testing, all (or almost all) memory elements are connected into one or more shift registers, as shown in the U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit-under-test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2-5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

Because of the random fill requirement, however, the test patterns are grossly over-specified. These large test patterns require extensive tester memory to store and a considerable time to apply from the tester to a circuit-under-test. FIG. 1 is a block diagram of a conventional system 18 for testing digital circuits with scan chains. External automatic testing equipment (ATE), or tester, 20 applies a set of fully specified test patterns 22 one by one to a CUT 24 in scan mode via scan chains 26 within the circuit. The circuit is then run in normal mode using the test pattern as input, and the test response to the test pattern is stored in the scan chains. With the circuit again in scan mode, the response is then routed to the tester 20, which compares the response with a fault-free reference response 28, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework, as shown in the U.S. Pat. No. 4,503,537. In BIST, additional on-chip circuitry is included to generate test patterns, evaluate test responses, and control the test. In conventional logic BIST, where pseudo-random patterns are used as test patterns, 95-96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. Very often the tester memory required to store the supplemental patterns in BIST exceeds 50% of the memory required in the deterministic approach described above. Another limitation of BIST is that other types of faults, such as transition or path delay faults, are not handled efficiently by pseudo-random patterns. Because of the complexity of the circuits and the limitations inherent in BIST, it is extremely difficult, if not impossible, to provide a set of specified test patterns that fully covers hard-to-test faults.

Weighted pseudo-random testing is another method that is used to address the issue of the random pattern resistant faults. In principle, this approach expands the pseudo-random test pattern generators by biasing the probabilities of the input bits so that the tests needed for hard-to-test faults are more likely to occur. In general, however, a circuit may require a very large number of sets of weights, and, for each weight set, a number of random patterns have to be applied. Thus, although the volume of test data is usually reduced in comparison to fully specified deterministic test patterns, the resultant test application time increases. Moreover, weighted pseudo-random testing still leaves a fraction of the fault list left uncovered. Details of weighted random pattern test systems and related methods can be found in a number of references including U.S. Pat. Nos. 4,687,988; 4,801,870; 5,394,405; 5,414,716; and 5,612,963. Weighted random patterns have been primarily used as a solution to compress the test data on the tester. The generation hardware appears to be too complex to place it on the chip. Consequently, the voluminous test data is produced off-chip and must pass through relatively slow tester channels to the circuit-under-test. Effectively, the test application time can be much longer than that consumed by the conventional deterministic approach using ATPG patterns.

Several methods to compress test data before transmitting it to the circuit-under-test have been suggested. They are based on the observation that the test cubes (i.e., the arrangement of test patterns bits as they are stored within the scan chains of a circuit-under-test) frequently feature a large number of unspecified (don't care) positions. One method, known as reseeding of linear feedback shift registers (LFSRs), was first proposed in B. Koenemann, "LFSR-Coded Test Patterns For Scan Designs," *Proc. European Test Conference*, pp. 237-242 (1991). Consider an n-bit LFSR with a fixed polynomial. Its output sequence is then completely determined by the initial seed. Thus, applying the feedback equations recursively provides a system of linear equations depending only on the seed variables. These equations can be associated with the successive positions of the LFSR output sequence. Consequently, a seed corresponding to the actual test pattern can be determined by solving the system of linear equations, where each equation represents one of the specified positions in the test pattern. Loading the resultant seed into the LFSR and subsequently clocking it will produce the desired test pattern. A disadvantage of this approach, however, is that seed, which encodes the contents of the test cube, is limited to approximately the size of the LFSR. If the test cube has more specified positions than the number of stages in LFSR, the test cube cannot be easily encoded with a seed. Another disadvantage of this approach is the time it requires. A tester cannot fill the LFSR with a seed concurrently with the LFSR generating a test pattern from the seed. Each of these acts must be done at mutually exclusive times. This makes the operation of the tester very inefficient, i.e., when the seed is serially loaded to the LFSR the scan chains do not operate; and when the loading of the scan chains takes place, the tester cannot transfer a seed to the LFSR.

Another compression method is based on reseeding of multiple polynomial LFSRs (MP-LFSRs) as proposed in S. Hellebrand et al., "Built-In Test For Circuits With Scan Based On Reseeding of Multiple Polynomial Linear Feedback Shift Registers," *IEEE Trans. On Computers*, vol. C-44, pp. 223-233 (1995). In this method, a concatenated group of test cubes is encoded with a number of bits specifying a seed and a polynomial identifier. The content of the MP-LFSR is loaded for each test group and has to be preserved during the decompression of each test cube within the group. The implementation of the decompressor involves adding extra memory elements to avoid overwriting the content of the MP-LFSR during the decompression of a group of test patterns. A similar technique has been also discussed in S. Hellebrand et al., "Pattern generation for a deterministic BIST scheme," *Proc. ICCAD*, pp. 88-94 (1995). Reseeding of MP-LFSRs was further enhanced by adopting the concept of variable-length seeds as described in J. Rajski et al., "Decompression of test data using variable-length seed LFSRs", *Proc. VLSI Test Symposium*, pp. 426-433 (1995) and in J. Rajski et al., "Test Data Decompression for Multiple Scan Designs with Boundary Scan", *IEEE Trans. on Computers*, vol. C-47, pp. 1188-1200 (1998). This technique has a potential for significant improvement of test pattern encoding efficiency, even for test cubes with highly varying number of specified positions. The same documents propose decompression techniques for circuits with multiple scan chains and mechanisms to load seeds into the decompressor structure through the boundary-scan. Although this scheme significantly improves encoding capability, it still suffers from the two drawbacks noted above: seed-length limitations and mutually exclusive times for loading the seed and generating test patterns therefrom.

The above reseeding methods thus suffer from the following limitations. First, the encoding capability of reseeding is limited by the length of the LFSR. In general, it is very difficult to encode a test cube that has more specified positions than the length of the LFSR. Second, the loading of the seed and test pattern generation therefrom are done in two separate, non-overlapping phases. This results in poor utilization of the tester time.

A different attempt to reduce test application time and test data volume is described in I. Hamzaoglu et al., "Reducing Test Application Time For Full Scan Embedded Cores," *Proc. FTCS-29*, pp. 260-267 (1999). This so-called parallel-serial full scan scheme divides the scan chain into multiple partitions and shifts in the same test pattern to each scan chain through a single scan input. Clearly, a given test pattern must not contain contradictory values on corresponding cells in different chains loaded through the same input. Although partially specified test cubes may allow such operations, the performance of this scheme strongly relies on the scan chain configuration, i.e., the number of the scan chains used and the assignment of the memory elements to the scan chains. In large circuits such a mapping is unlikely to assume any desired form, and thus the solution is not easily scalable. Furthermore, a tester using this scheme must be able to handle test patterns of different scan chain lengths, a feature not common to many testers.

SUMMARY

A method according to the invention for applying test patterns to scan chains in a circuit-under-test includes providing a compressed test pattern of bits; decompressing the compressed test pattern into a decompressed test pattern of bits as the compressed test pattern is being provided; and applying the decompressed test pattern to scan chains of the circuit-under-test. If desired, the method may further include applying the decompressed test pattern to scan chains of the circuit-under-test as the compressed test pattern is being provided.

The method may also include providing the compressed test pattern, decompressing the compressed test pattern, and applying the decompressed pattern synchronously. These acts may be performed at a same clock rate. Alternatively, the compressed test pattern may be provided at a lower clock rate and the compressed test pattern decompressed and applied at a higher clock rate. In yet another alternative, the compressed pattern may be provided and decompressed at a higher clock rate and the decompressed pattern applied at a lower clock rate.

Decompressing the compressed test pattern may comprise generating during a time period a greater number of decompressed test pattern bits than the number of compressed test pattern bits provided during the same time period. One way the greater number of bits may be generated is by providing a greater number of outputs for decompressed test pattern bits than the number of inputs to which the compressed test pattern bits are provided. Another way the greater number of bits may be generated is by generating the decompressed test pattern bits at a higher clock rate than the clock rate at which the compressed test pattern bits are provided.

Decompressing the compressed test pattern may further comprise generating each bit of the decompressed pattern by logically combining two or more bits of the compressed test pattern.

This logically combining may include combining the bits with an XOR operation, an X-NOR operation or a combination of the two operations.

In one embodiment of the invention, the providing and decompressing occur within the circuit-under-test. In another embodiment of the invention, the providing and decompressing occur within a tester, the tester applying the decompressed test pattern to scan chains of the circuit-under-test.

A circuit according to the invention may comprise a decompressor, circuit logic, and scan chains for testing the circuit logic. The decompressor is adapted to receive a compressed test pattern of bits and decompress the test pattern into a decompressed test pattern of bits as the compressed test pattern is being received. The scan chains are coupled to the decompressor and are adapted to receive the decompressed test pattern. The decompressor may comprise a linear finite state machine adapted to receive the compressed test pattern.

A tester according to the invention may comprise storage, a decompressor, and one or more tester channels. The storage is adapted to store a set of compressed test patterns of bits. The decompressor is coupled to the storage and adapted to receive a compressed test pattern of bits provided from the storage and to decompress the test pattern into a decompressed test pattern of bits as the compressed test pattern is being received. The tester channels are coupled to the decompressor and adapted to receive a decompressed test pattern and apply the decompressed test pattern to a circuit-under-test.

These and other aspects and features of the invention are described below with reference to the accompanying drawings.

BRIEF DESCRIPTION OF THE DRAWINGS

FIG. 7 shows the logical expressions for the bits stored in each scan cell in the scan chain of FIG. 5

DETAILED DESCRIPTION

Figure 1:
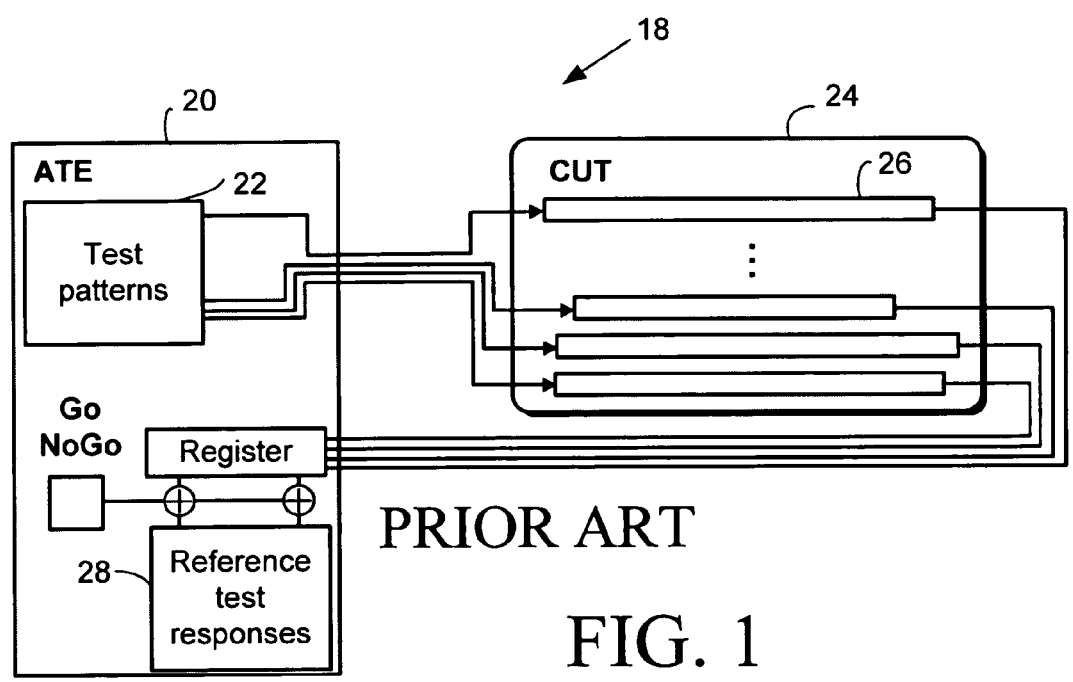
FIG. 1 is a block diagram of a conventional system for testing digital circuits with scan chains.
Figure 2:
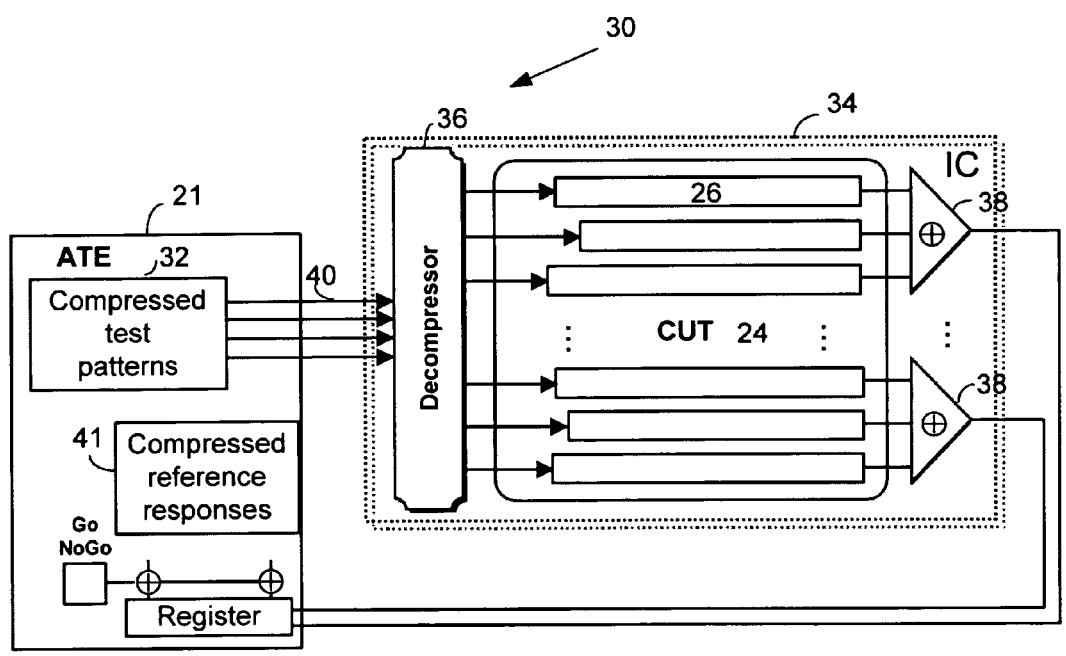
FIG. 2 is a block diagram of a test system according to the invention for testing digital circuits with scan chains.

FIG. 2 is a block diagram of a system 30 according to the invention for testing digital circuits with scan chains. The system includes a tester 21 such as external automatic testing equipment (ATE) and a circuit 34 that includes as all or part of it a circuit-under-test (CUT) 24. The tester 21 provides from storage a set of compressed test patterns 32 of bits, one pattern at a time, through tester channels 40 to the circuit 34 such as an IC. A compressed pattern, as will be described, contains far fewer bits than a conventional uncompressed test pattern. A compressed pattern need contain only enough information to recreate deterministically specified bits. Consequently, a compressed pattern is typically 2% to 5% of the size of a conventional test pattern and requires much less tester memory for storage than conventional patterns. As importantly, compressed test patterns require much less time to transmit from a tester to a CUT 24.

Unlike in the prior reseeding techniques described above, the compressed test patterns 32 are continuously provided from the tester 21 to scan chains 26 within the CUT 24 without interruption. As the compressed test pattern is being provided by the tester 21 to the input channels of a decompressor 36 within the circuit 34, the decompressor decompresses the compressed pattern into a decompressed pattern of bits. The decompressed test pattern is then applied to the scan chains 26. This application is preferably done while the compressed test pattern is being provided to the circuit 34, but it need not be so. After circuit logic within the CUT 24 is clocked with a decompressed test pattern in the scan chains 26, the test response to that pattern is captured in the scan chains and transmitted to the tester 21 for comparison with the compressed fault-free reference responses 41 stored therein.

In a typical configuration, the decompressor 36 has one output per scan chain 26, and there are more scan chains than input channels to the decompressor. However, as will be described, other configurations are also possible in which the decompressor outputs are fewer than or equal to the input channels. The decompressor generates in a given time period a greater number of decompressed bits at its outputs than the number of compressed pattern bits it receives during the same time period. This is the act of decompression, whereby the decompressor 36 generates a greater number of bits than are provided to it in a given time period.

Figure 3:
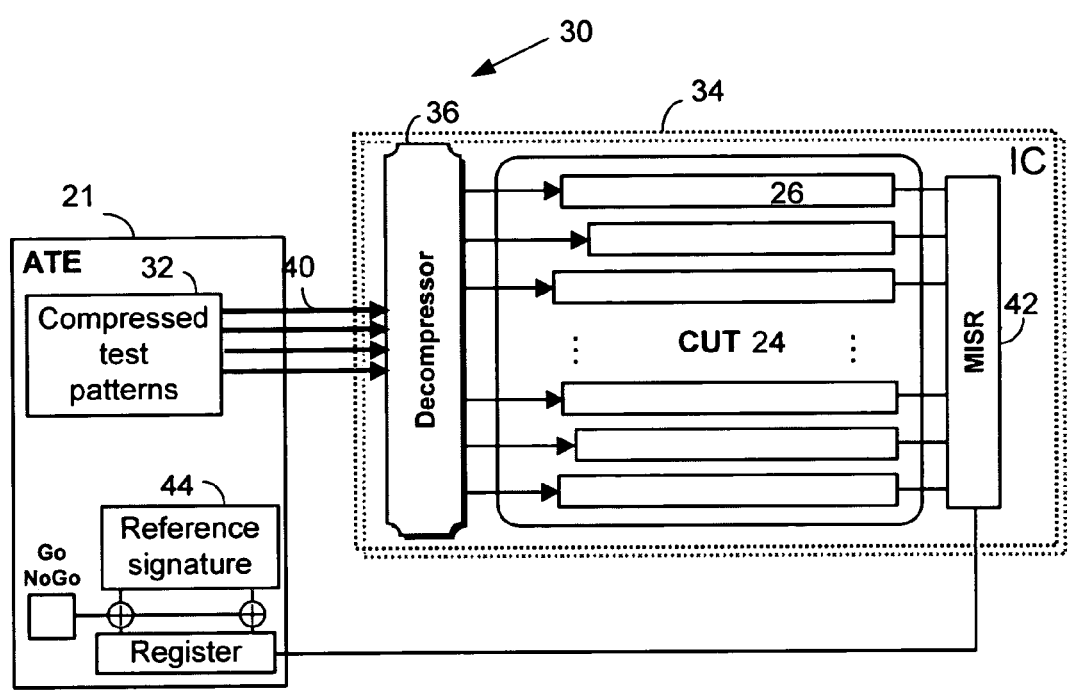
FIG. 3 is a block diagram of a second embodiment of a system according to the invention for testing digital circuits with scan chains.

To reduce the data volume of the test response and the time for sending the response to the tester, the circuit 34 can include means for compressing the test response that is read from the scan chains 26. One structure for providing such compression is one or more spatial compactors 38. The compressed test responses produced by the compactors 38 are then compared one by one with compressed reference responses 40. A fault is detected if a reference response does not match an actual response. FIG. 3 shows another structure that can be used for compressing the test response. A multiple input signature register (MISR) 42 compresses multiple test pattern responses into a signature that is then sent to the tester. There it is compared to a reference signature 44. Compacting the test response in the above ways is desirable but not necessary to the present decompression method and system.

The providing of a compressed test pattern to a circuit, its decompression into a decompressed test pattern, and the application of the decompressed test pattern to the scan chains is performed synchronously, continuously, and substantially concurrently. The rate at which each act occurs, however, can vary. All acts can be performed synchronously at a same clock rate if desired. Or the acts can be performed at different clock rates. If the acts are performed at the same clock rate, or if the compressed test patterns are provided and decompressed at a higher clock rate than at which the decompressed test patterns are applied to the scan chains, then the number of outputs of decompressor 36 and associated scan chains will exceed the number of input channels of the decompressor, as in FIG. 2. In this first case, decompression is achieved by providing more decompressor outputs than input channels. If the compressed test patterns are provided at a lower clock rate and decompressed and applied to the scan chains at a higher clock rate, then the number of outputs and associated scan chains can be the same, fewer, or greater than the number of input channels. In this second case, decompression is achieved by generating the decompressed test pattern bits at a higher clock rate than the clock rate at which the compressed test pattern bits are provided.

Figure 4A:
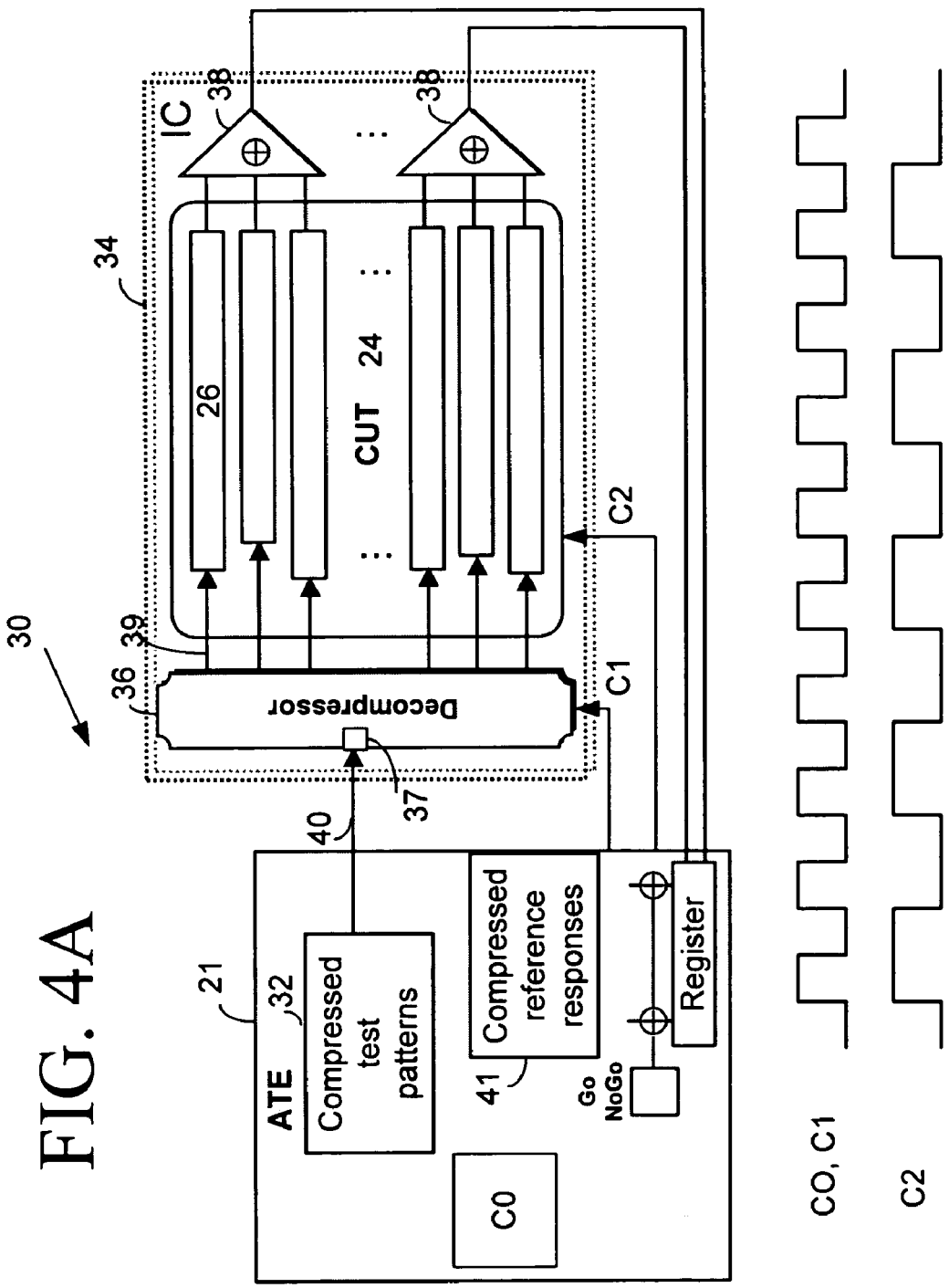
FIGS. 4A-B are block diagrams of a test system according to the invention include timing diagrams illustrating different possible timing relationships possible between the components of the system.

FIG. 4A illustrates an embodiment of the first case in which the compressed pattern is provided and decompressed at a higher clock rate and the decompressed pattern is applied synchronously to the scan chains at a lower clock rate. The tester 21 provides the bits of the compressed pattern through a tester channel 40 to an input channel 37 of the decompressor 36 at a higher rate set by clock 0 (C0). The decompressor is clocked by clock 1 (C1) at the same rate as the tester and produces at outputs 39 the bits of the decompressed pattern at that rate. These decompressed bits, however, are applied to the scan chains 26 at a lower rate set by clock 2 (C2), which clocks the bits into the scan chains. This difference in rates is illustrated in the exemplary timing diagram in FIG. 4A (the actual difference can be much greater). Because of the difference therein, only every other output of the decompressor is written to the scan chains. But that is taken into account in the initial test pattern generation. One advantage of clocking the tester, decompressor, and scan chains as shown is that the tester requires fewer channels than the number of scan chains to provide the test pattern to the CUT 24. By clocking the tester at a higher clock rate C0, the time required to apply the compressed test pattern to the circuit 34 is significantly reduced. Another advantage is in low power applications, where the power dissipated during test mode has to be controlled. This can be done by reducing the clock rate C2 at which bits are shifted into the scan chains.

Figure 4B:
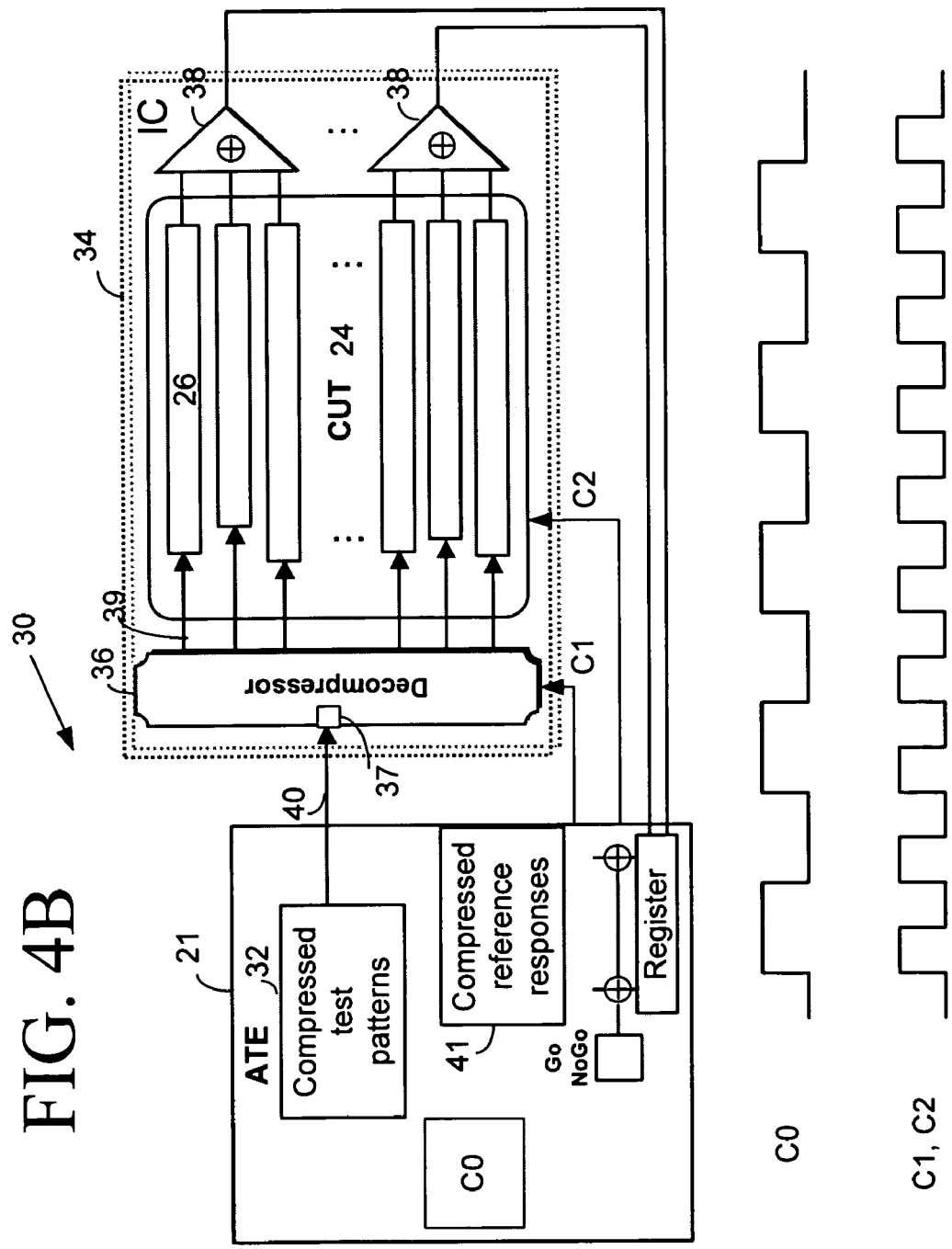

FIG. 4B illustrates an embodiment of the second case in which the compressed test pattern is provided at a lower clock rate and decompressed and applied synchronously at a higher clock rate. Here, the tester 21 provides the bits of the compressed pattern through channels 40 to the input channels 37 of the decompressor 36 at a lower rate set by clock 0 (C0). The decompressor is clocked by clock 1 (C1) at a higher rate. The decompressed bits are applied through its outputs 39 to the scan chains 26 by clock 2 (C2) at the same rate as clock 1. This difference in rates is illustrated in the exemplary timing diagram in FIG. 4B (the actual difference can be much greater). Because of the difference, the decompressor 36 reads the same bits from the tester 21 twice before they change. The decompressor, however, includes a state machine, as will be described, and its outputs change each clock cycle because its internal states change. One advantage of clocking the tester, decompressor, and scan chains as shown in FIG. 4B is that one can utilize a tester 21 that has many channels but with little memory behind them. By providing bits on more tester channels per clock cycle, the lack of memory depth is overcome and the time required for applying the compressed test pattern is reduced.

Figure 5:
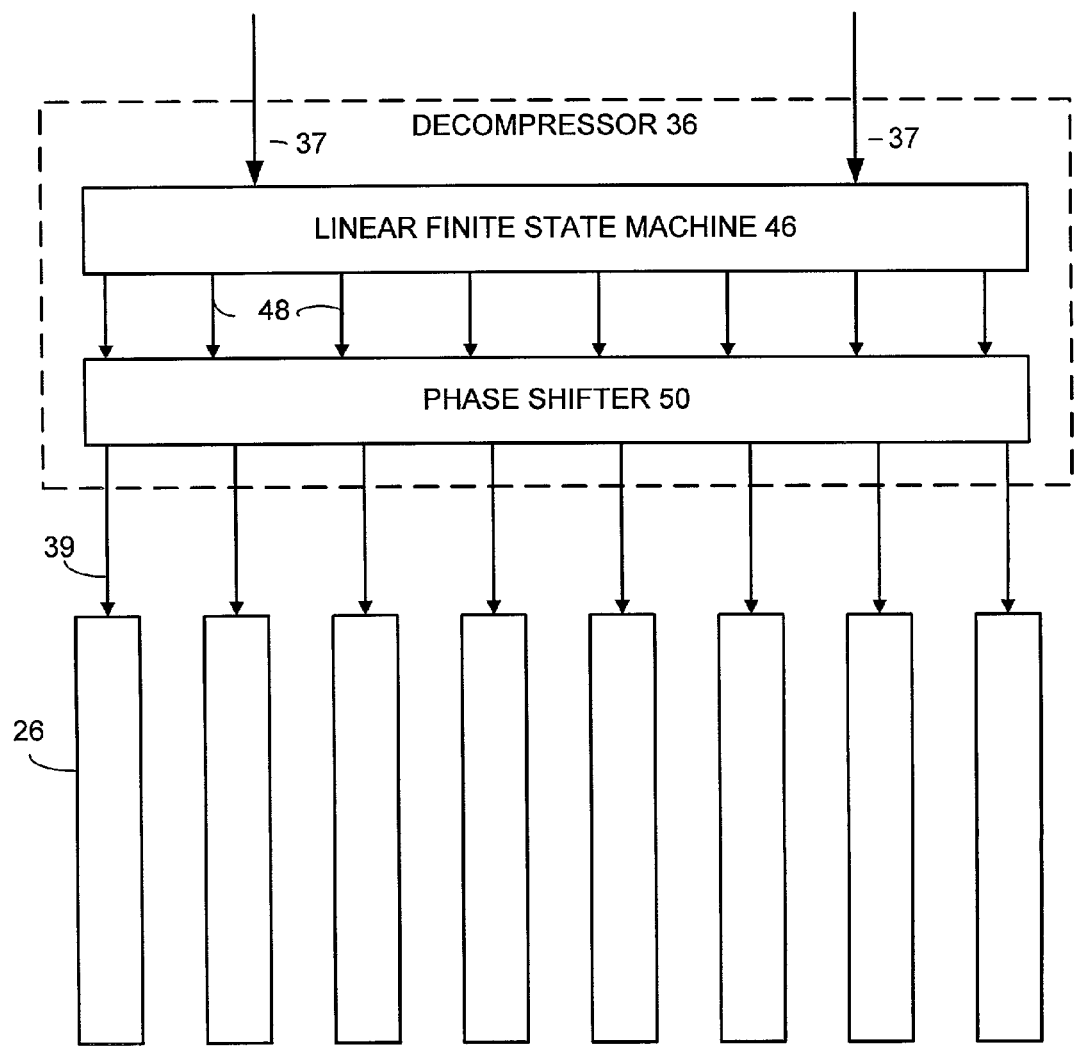
FIG. 5 is a block diagram of a decompressor according to the invention, including a linear finite state machine (LFSM) and phase shifter.

FIG. 5 is a block diagram of a decompressor according to the invention. In a preferred embodiment, decompressor 36 comprises a linear finite state machine (LFSM) 46 coupled, if desired, through its taps 48 to a phase shifter 50. The LFSM through the phase shifter provides highly linearly independent test patterns to the inputs of numerous scan chains in the CUT 24. The LFSM can be built on the basis of the canonical forms of linear feedback shift registers, cellular automata, or transformed LFSRs that can be obtained by applying a number of m-sequence preserving transformations. The output of the LFSM is applied to the phase shifter, which ensures that the decompressed pattern bits present within each of the multiple scan chains 26 at any given time do not overlap in pattern (i.e., are out of phase).

The concept of continuous flow decompression described herein rests on the fact noted above that deterministic test patterns typically have only between 2 to 5% of bits deterministically specified, with the remaining bits randomly filled during test pattern generation. (Test patterns with partially specified bit positions are called test cubes, an example of which appears in Table 2.) These partially specified test cubes are compressed so that the test data volume that has to be stored externally is significantly reduced. The fewer the number of specified bits in a test cube, the better is the ability to encode the information into a compressed pattern. The ability to encode test cubes into a compressed pattern is exploited by having a few decompressor input channels driving the circuit-under-test, which are viewed by the tester as virtual scan chains. The actual CUT 24, however, has its memory elements connected into a large number of real scan chains. Under these circumstances, even a low-cost tester that has few scan channels and sufficiently small memory for storing test data can drive the circuit externally.

Figure 6:
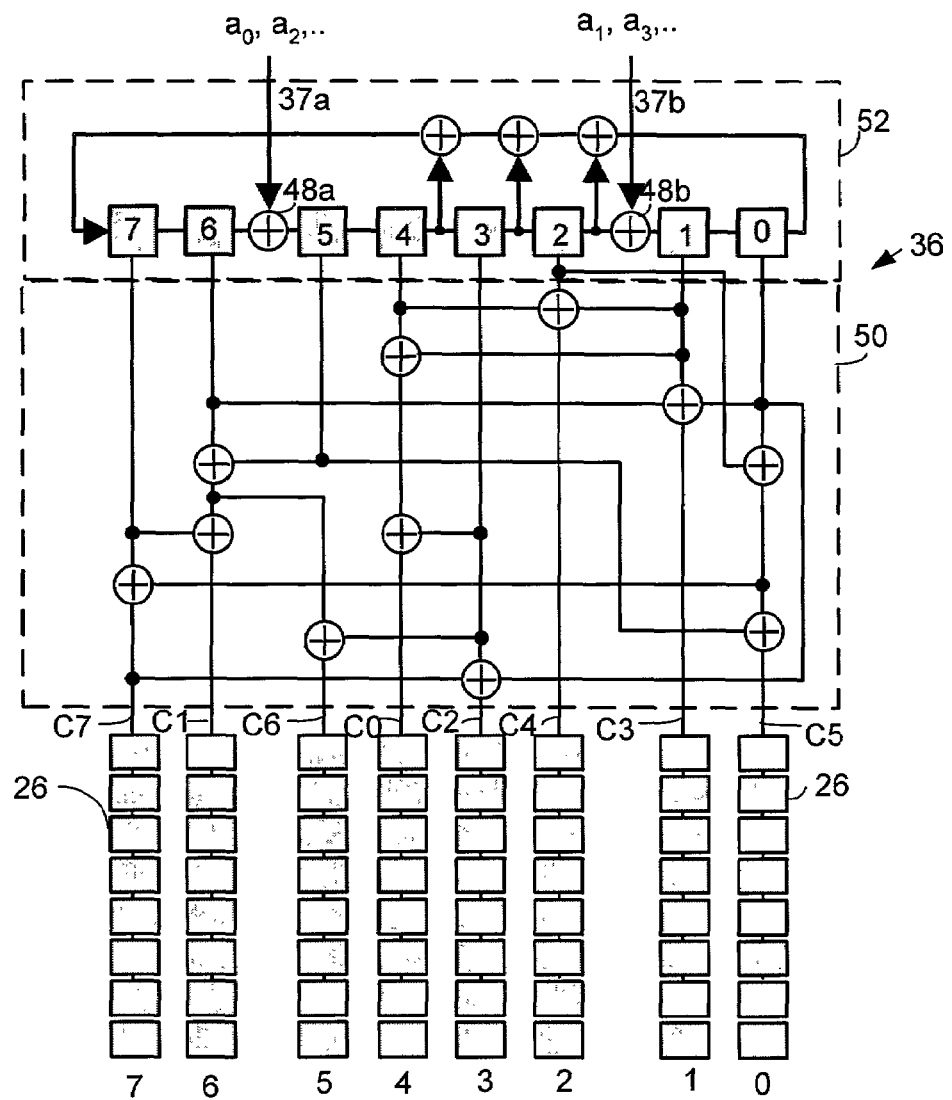
FIG. 6 shows in more detail a first embodiment of the decompressor of FIG. 5 coupled to a scan chain.

FIG. 6 shows in more detail a first embodiment of the decompressor of FIG. 5. The LFSM is embodied in an eight stage Type 1 LFSR 52 implementing primitive polynomial $h(x)=x^8+x^4+x^3+x^2+1$. The phase shifter 50, embodied in a number of XOR gates, drives eight scan chains 26, each eight bits long. The structure of the phase shifter is selected in such a way that a mutual separation between its output channels C0-C7 is at least eight bits, and all output channels are driven by 3-input (tap) XOR functions having the following forms:

TABLE 1

$$C_0 = s_4 \oplus s_3 \oplus s_1$$
$$C_1 = s_7 \oplus s_6 \oplus s_5$$
$$C_2 = s_7 \oplus s_3 \oplus s_2$$
$$C_3 = s_6 \oplus s_1 \oplus s_0$$
$$C_4 = s_4 \oplus s_2 \oplus s_1$$
$$C_5 = s_5 \oplus s_2 \oplus s_0$$
$$C_6 = s_6 \oplus s_5 \oplus s_3$$
$$C_7 = s_7 \oplus s_2 \oplus s_0$$

where $C_i$ is the ith output channel and $s_k$ indicates the kth stage of the LFSR. Assume that the LFSR is fed every clock cycle through its two input channels 37a, 37b and input injectors 48a, 48b (XOR gates) to the second and the sixth stages of the register. The input variables "a" (compressed test pattern bits) received on channel 37a are labeled with even subscripts ($a_0$, $a_2$, $a_4$, . . . ) and the variables "a" received on channel 37b are labeled with odd subscripts ($a_1$, $a_3$, $a_5$, . . . ). Treating these external variables as Boolean, all scan cells can be conceptually filled with symbolic expressions being linear functions of input variables injected by tester 21 into the LFSR 52. Given the feedback polynomial, the phase shifter 50, the location of injectors 48a, b as well as an additional initial period of four clock cycles during which only the LFSR is supplied by test data, the contents of each scan cell within the scan chains 26 in FIG. 6 can be logically determined. FIG. 7 gives the expressions for the 64 scan cells in FIG. 6, with the scan chains numbered 0 through 7 in FIG. 6 corresponding to the scan chains C7, C1, C6, . . . identified in FIG. 6. The expressions for each scan chain in FIG. 7 are listed in the order in which the information is shifted into the chain, i.e., the topmost expression represents the data shifted in first.

Assume that the decompressor 36 in FIG. 6 is to generate a test pattern based on the following partially specified test cube in Table 2 (the contents of the eight scan chains are shown here horizontally, with the leftmost column representing the information that is shifted first into the scan chains):

TABLE 2

| | |
|---|---|
| xxxxxxxx | scan chain 0 |
| xxxxxxxx | scan chain 1 |
| xxxx11xx | scan chain 2 |
| xx0xxx1x | scan chain 3 |
| xxxx0xx1 | scan chain 4 |
| xx0x0xxx | scan chain 5 |
| xx1x1xxx | scan chain 6 |
| xxxxxxxx | scan chain 7 |

The variable x denotes a "don't care" condition. Then a corresponding compressed test pattern can be determined by solving the following system of ten equations from FIG. 7 using any of a number of well-known techniques such as Gauss-Jordan elimination techniques. The selected equations correspond to the deterministically specified bits:

TABLE 3

$$a_2 \oplus a_6 \oplus a_{11} = 1$$
$$a_0 \oplus a_1 \oplus a_4 \oplus a_8 \oplus a_{13} = 1$$
$$a_4 \oplus a_5 \oplus a_9 \oplus a_{11} = 0$$
$$a_0 \oplus a_2 \oplus a_5 \oplus a_{12} \oplus a_{13} \oplus a_{17} \oplus a_{19} = 1$$
$$a_1 \oplus a_2 \oplus a_4 \oplus a_5 \oplus a_6 \oplus a_8 \oplus a_{12} \oplus a_{15} = 0$$
$$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21} = 1$$
$$a_2 \oplus a_3 \oplus a_4 \oplus a_9 \oplus a_{10} = 0$$
$$a_0 \oplus a_1 \oplus a_2 \oplus a_6 \oplus a_7 \oplus a_8 \oplus a_{13} \oplus a_{14} = 0$$
$$a_3 \oplus a_4 \oplus a_5 \oplus a_6 \oplus a_{10} = 1$$
$$a_0 \oplus a_1 \oplus a_3 \oplus a_7 \oplus a_8 \oplus a_9 \oplus a_{10} \oplus a_{14} = 1$$

It can be verified that the resulting seed variables $a_0, a_1, a_2, a_3$ and $a_{13}$ are equal to the value of one while the remaining variables assume the value of zero. This seed will subsequently produce a fully specified test pattern in the following form (the initial specified positions are underlined):

TABLE 4

| | | | | | | | |
|---|---|---|---|---|---|---|---|
| 1 | 0 | 1 | 0 | 0 | 1 | 0 | 0 |
| 1 | 1 | 0 | 0 | 0 | 1 | 0 | 0 |
| 1 | 1 | 1 | 1 | <u>1</u> | <u>1</u> | 1 | 0 |
| 0 | 0 | <u>0</u> | 1 | 0 | 0 | <u>1</u> | 1 |
| 1 | 0 | 1 | 0 | <u>0</u> | 0 | 0 | <u>1</u> |
| 1 | 1 | <u>0</u> | 1 | <u>0</u> | 0 | 0 | 0 |
| 1 | 1 | <u>1</u> | 1 | <u>1</u> | 1 | 1 | 1 |
| 0 | 1 | 0 | 0 | 1 | 1 | 0 | 0 |

As can be observed, the achieved compression ratio (defined as the number of scan cells divided by the number of compressed pattern bits) is 64/(2×8+2×4)≈2.66. The fully specified test pattern is then compressed into a compressed pattern of bits using any of a number of known methods.

Figure 8A:
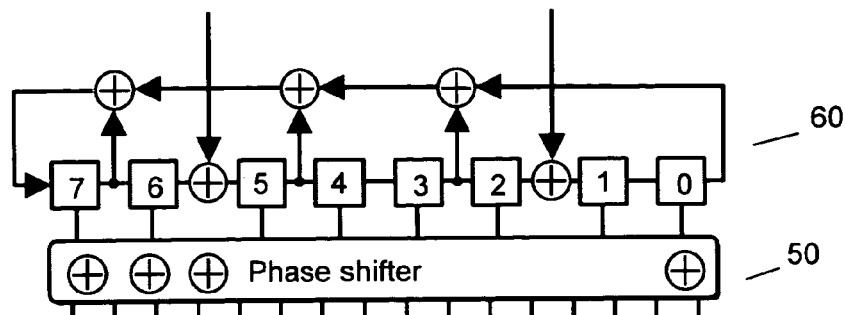
FIGS. 8A-8D illustrate alternative embodiments of the LFSM of FIG. 5.
Figure 8B:
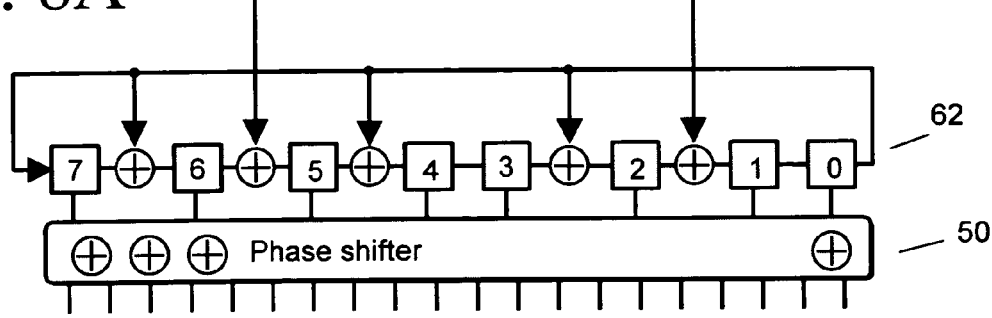
Figure 8C:
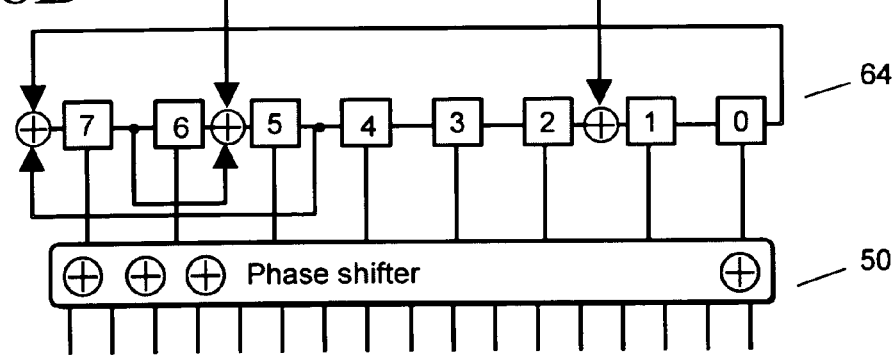
Figure 8D:
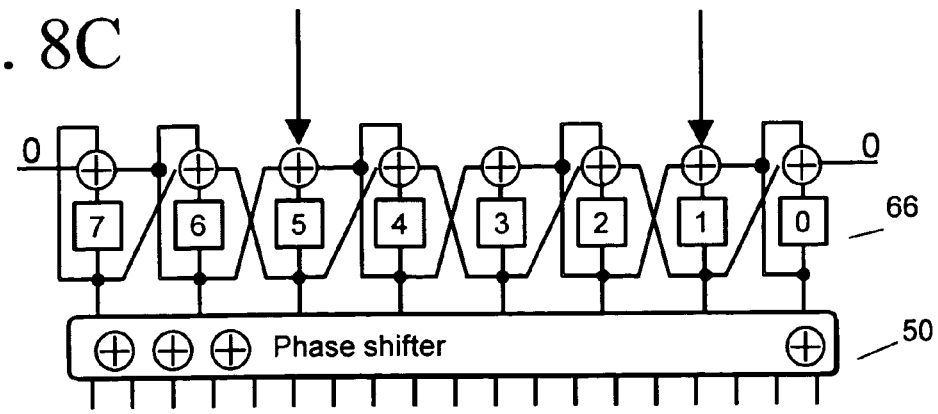

FIGS. 8A-D illustrate various embodiments for the LFSM 46 of FIG. 5. FIG. 8A is a Type I LFSR 60. FIG. 8B is a Type II LFSR 62. FIG. 8C is a transformed LFSR 64. And FIG. 8D is a cellular automaton 66. All of them implement primitive polynomials. Except for the cellular automaton 66, in each case the LFSM includes a number of memory elements connected in a shift register configuration. In addition, there are several feedback connections between various memory cells that uniquely determine the next state of the LFSM. The feedback connections are assimilated into the design by introducing injectors in the form of XOR gates near the destination memory elements. The input channels 37 provide the bits of a compressed pattern to the LFSM through input injectors 48a, b. The injectors are handled similarly as the other feedback connections within the LFSM except that their sources of bits are the input channels. The input channels 37 may have multiple fan-outs driving different LFSM injectors 48 to improve the encoding efficiency.

Figure 9:
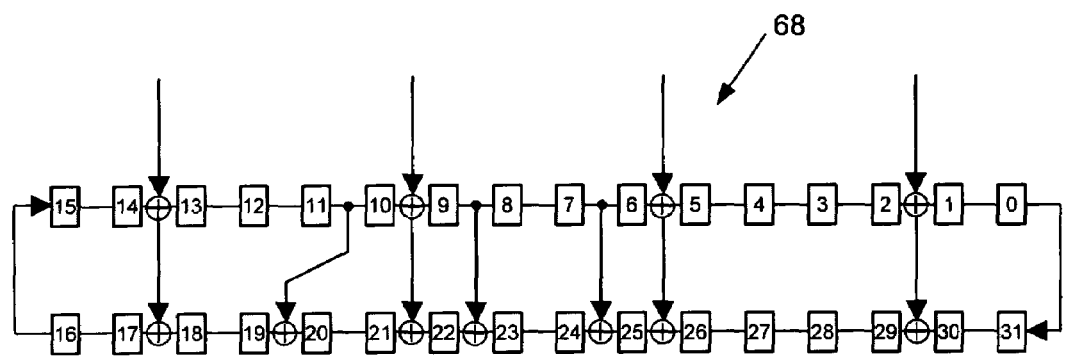
FIG. 9 illustrates a preferred embodiment of a 32-bit LFSM

FIG. 9 shows a preferred embodiment of a 32-bit LFSM in the form of a re-timed LFSR 68. The injectors are spaced equally so that the input variables are distributed optimally once they are injected into the LFSM. In practice, the size of the LFSM depends on the number of real scan chains in a circuit, the desired compression ratio of encoding, and on certain structural properties of the circuit-under-test.

Figure 10:
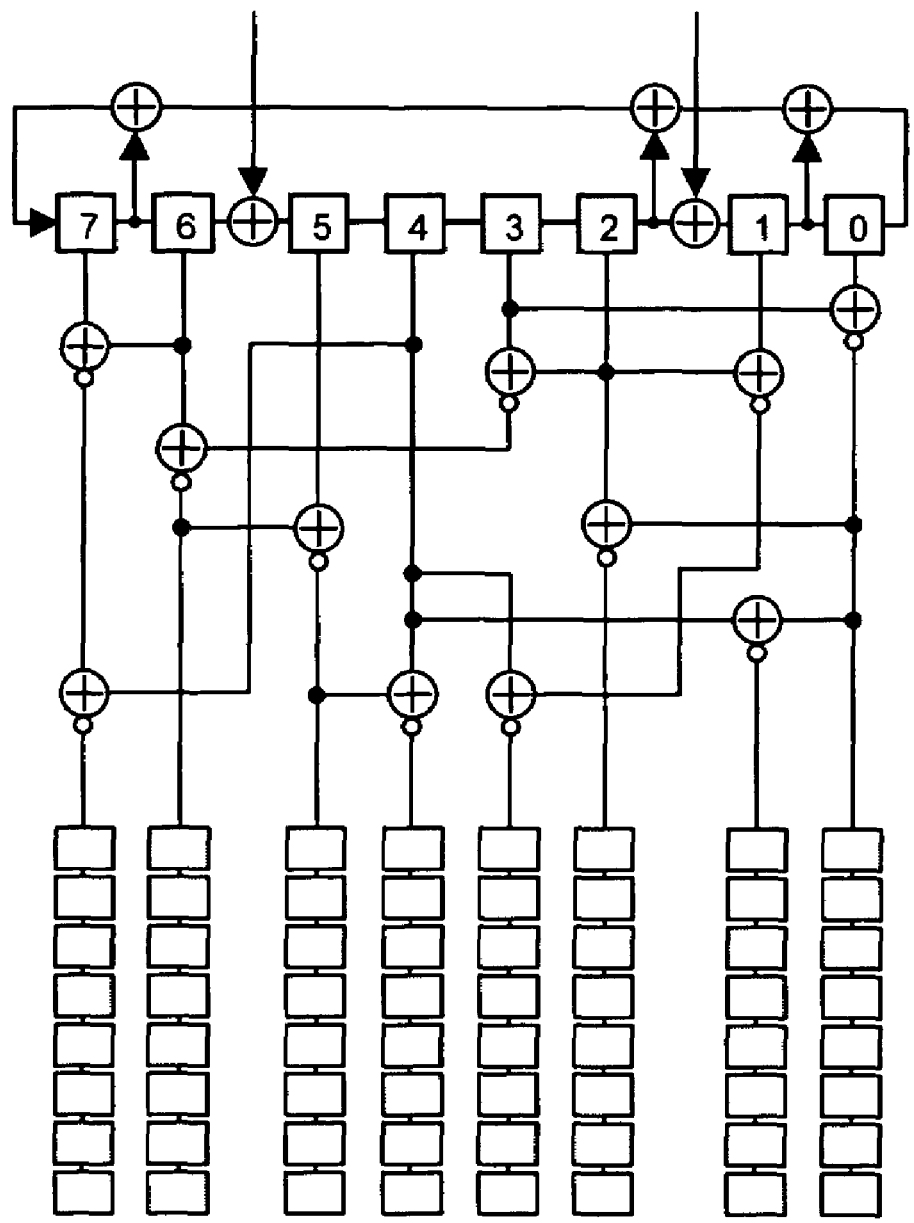
FIG. 10 illustrates an alternative embodiment of the phase shifter of FIG. 5.

FIG. 10 illustrates an alternative embodiment of a phase shifter 50, constructed with an array of XNOR gates rather than XOR gates. Phase shifters can be constructed with combinations of XNOR and XOR gates as well.

Figure 11:
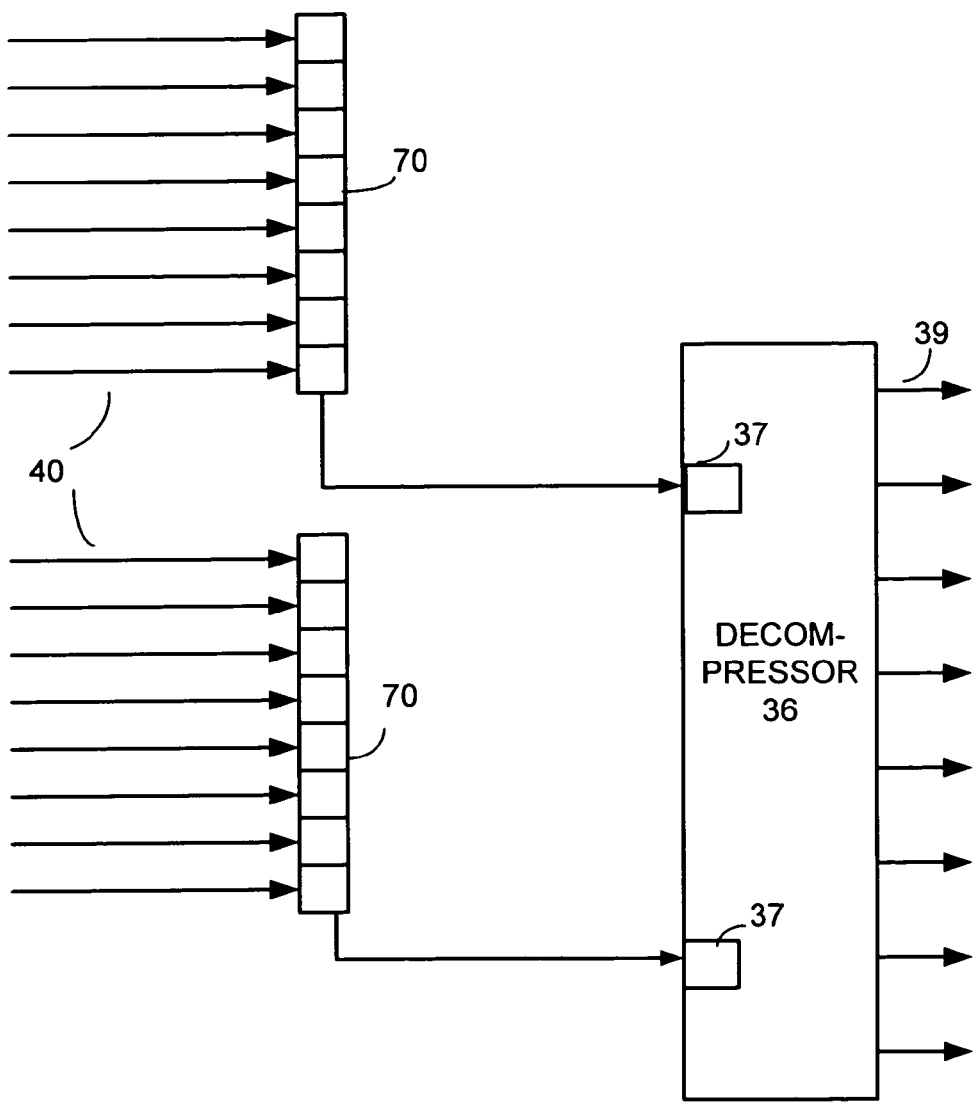
FIG. 11 illustrates the use of parallel-to-serial conversion for applying a compressed test pattern to the decompressor.

FIG. 11 illustrates the use of parallel-to-serial conversion for applying a compressed test pattern to the decompressor. If the input channels 37 to the decompressor 36 are fewer in number than the number of channels 40 of the tester 21, it can be advantageous to provide a parallel-to-serial converter such as registers 70 at the input to the decompressor. The registers 70 are clocked such that their contents are shifted out before the next set of bits is applied to the register from the tester 21. The continuous flow of the test patterns is thus preserved.

Figure 12:
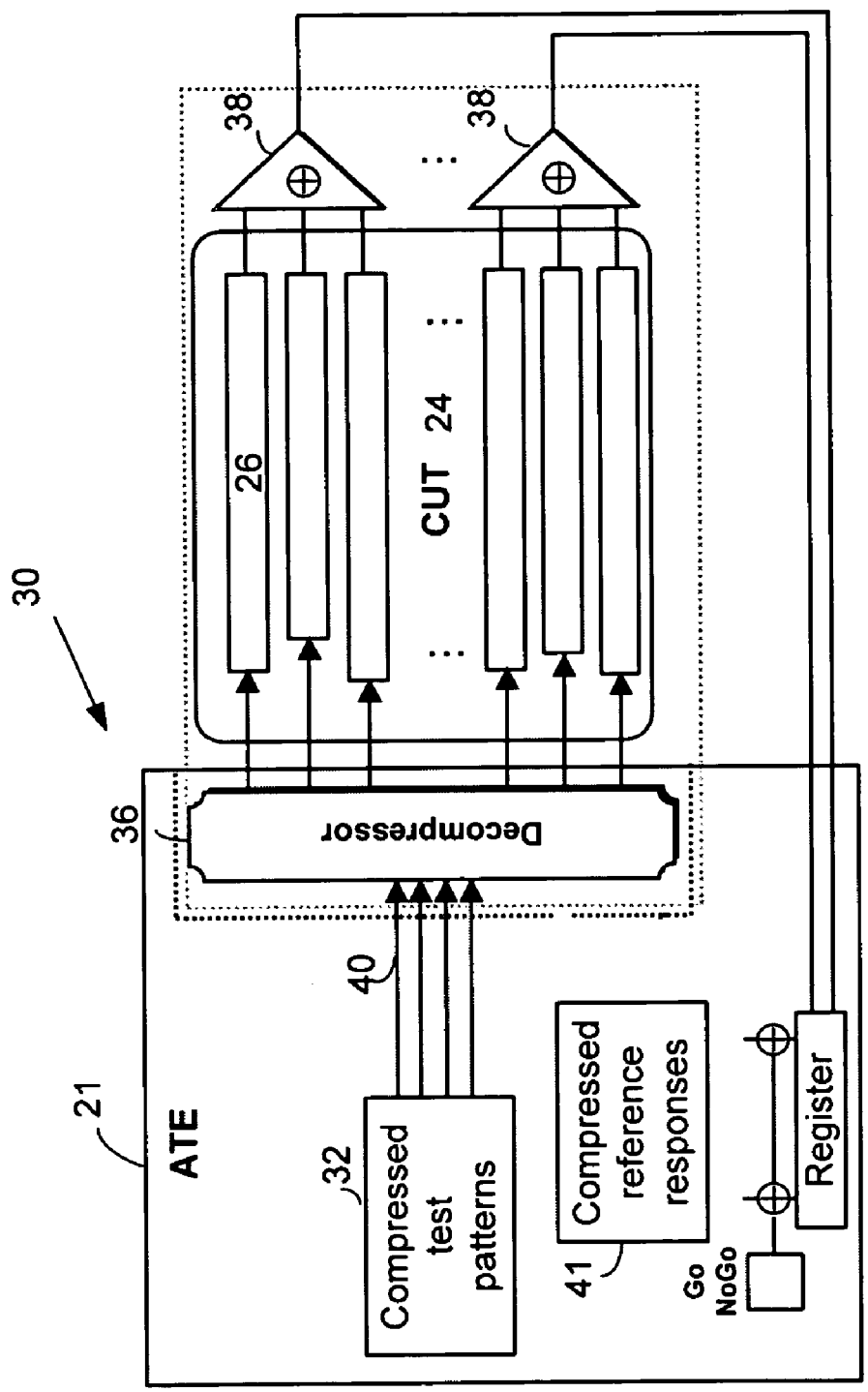
FIG. 12 is a block diagram of a tester according to the invention for testing digital circuits with scan chains.

FIG. 12 is a block diagram of a tester 21 embodiment that includes the decompressor 36, rather than providing it in the circuit 34. The tester decompresses the test pattern internally and transmits the decompressed test pattern to the CUT 24. Such a tester has advantages where testing time is not as critical and it is preferred not to add a decompressor to each circuit-under-test. Storage requirements are still reduced because compressed test patterns (rather than full test patterns) need only be stored. In addition, in a variation of the above tester embodiment, the compactors 38 can also be included in the tester 21 rather than the circuit 34. The circuit then returns uncompressed test responses to the tester. This further simplifies the circuit's design.

The process of decompressing a test pattern will now be described in more detail, with reference to FIG. 5. The LFSM 46 starts its operation from an initial all-zero state. Assuming an n-bit LFSM and m input injectors, ⌈n/m⌉ clock cycles may be used to initialize the LFSM before it starts generating bits corresponding to the actual test patterns. After initialization of the LFSM and assuming clocks C0 and C1 are running at the same rate, a new bit is loaded in parallel into each scan chain 26 every clock cycle via the phase shifter 50. At this time, the circuit-under-test 34 is operated in the scan mode, so that the decompressed test pattern fills the scan chains 26 with 0s and 1s (and shifts out any previous test response stored there). A small number of bit positions in the scan chains, therefore, get deterministically specified values while the remaining positions are filled with random bits generated by the LFSM. The number of clock cycles for which a test pattern is shifted is determined by the length of the longest scan chain within the circuit, the number being at least as great as the number of cells in the longest scan chain. A scan-shift signal is therefore held high for all the scan chains until the longest scan chain gets the entire test pattern. The shorter scan chains in the circuit are left justified so that the first few bits that are shifted are overwritten without any loss of information.

Patterns from the LFSM may be linearly dependent. In other words, it is possible to determine various bit positions within the two-dimensional structure of multiple scan chains that are significantly correlated. This causes testability problems, as it is often not possible to provide the necessary stimulus for fault excitation to the gates driven by positions that have some form of dependency between them. Consequently, the phase shifter 50 (such as an array of XOR gates or XNOR gates) may be employed at the taps (outputs) of the LFSM to reduce linear dependencies between various bit positions within the scan chains. The XOR logic can be two-level or multi-level depending on the size of the XOR gates. Every scan chain in the CUT 24 is driven by signals that are obtained by XOR-ing a subset of taps 48 from the LFSM. These taps are determined so that the encoding efficiency of the test cubes is still preserved. In addition, the taps are selected in a manner so that all memory cells in the LFSM have approximately equal number of fan-out signals and the propagation delays are suitably optimized. Once a decompressed test pattern is completely loaded into the scan chains during test mode, the CUT 24 is switched to the normal mode of operation. The CUT then performs its normal operation under the stimulus provided by the test pattern in the scan chains. The test response of the CUT is captured in the scan chains. During the capture the LFSM is reset to the all-zero state before a new initialization cycle begins for loading the next test pattern.

Having illustrated and described the principles of the invention in exemplary embodiments, it should be apparent to those skilled in the art that the illustrative embodiments can be modified in arrangement and detail without departing from such principles. In view of the many possible embodiments to which the principles of the invention may be applied, it should be understood that the illustrative embodiment is intended to teach these principles and is not intended to be a limitation on the scope of the invention. We therefore claim as our invention all that comes within the scope and spirit of the following claims and their equivalents.

We claim:

1. A method for applying test patterns to scan chains in a circuit-under-test, the method comprising:
    providing a compressed test pattern of bits;
    decompressing the compressed test pattern into a decompressed test pattern of bits as the compressed test pattern is being provided;
    applying the decompressed test pattern to scan chains of the circuit-under-test; and
    providing the compressed test pattern through input channels to a circuit-under-test, the number of input channels being fewer than the number of scan chains to which the decompressed pattern is applied.

2. The method of claim 1 wherein decompressing the compressed test pattern comprises generating one or more bits of the decompressed pattern by logically combining two or more bits of the compressed test pattern, and wherein logically combining two or more bits of the compressed test pattern comprises combining the bits with an XNOR operation.

3. The method of claim 1, wherein decompressing the compressed test pattern comprises generating one or more bits of the decompressed pattern by logically combining two or more bits of the compressed test pattern.

4. The method of claim 3, wherein logically combining two or more bits of the compressed test pattern comprises combining the bits with an XOR operation.

5. The method of claim 1, wherein the compressed test pattern is a deterministic test pattern.

6. The method of claim 1, wherein the providing and decompressing occur within the circuit-under-test.

7. A method for applying test patterns to scan chains in a circuit-under-test, the method comprising:
    providing a compressed test pattern of bits;
    decompressing the compressed test pattern into a decompressed test pattern of bits as the compressed test pattern is being provided; and
    applying the decompressed test pattern to scan chains of the circuit-under-test,
    wherein the compressed test pattern is provided at a lower clock rate and the compressed test pattern is decompressed and applied synchronously at a higher clock rate.

8. The method of claim 7, wherein decompressing the compressed test pattern comprises generating one or more bits of the decompressed pattern by logically combining two or more bits of the compressed test pattern.

9. The method of claim 8, wherein logically combining two or more bits of the compressed test pattern comprises combining the bits with an XOR operation.

10. The method of claim 7, wherein the compressed test pattern is a deterministic test pattern.

11. The method of claim 7, wherein the providing and decompressing occur within the circuit-under-test.

12. A method for applying test patterns to scan chains in a circuit-under-test, the method comprising:
    providing a compressed test pattern of bits;
    decompressing the compressed test pattern into a decompressed test pattern of bits as the compressed test pattern is being provided; and
    applying the decompressed test pattern to scan chains of the circuit-under-test,
    wherein the compressed pattern is provided and decompressed at a higher clock rate and the decompressed pattern is applied synchronously at a lower clock rate.

13. A method for applying test patterns to scan chains in a circuit-under-test, the method comprising:
    providing a compressed test pattern of bits;
    decompressing the compressed test pattern into a decompressed test pattern of bits as the compressed test pattern is being provided; and
    applying the decompressed test pattern to scan chains of the circuit-under-test,
    wherein decompressing the compressed test pattern comprises generating during a time period a greater number of decompressed test pattern bits than the number of compressed test pattern bits provided during the same time period.

14. The method of claim 13 wherein the greater number of bits is generated by providing a greater number of outputs for decompressed test pattern bits than the number of inputs to which the compressed test pattern bits are provided.

15. The method of claim 13 wherein the greater number of bits is generated by generating the decompressed test pattern bits at a higher clock rate than the clock rate at which the compressed test pattern bits are provided.

16. The method of claim 13, wherein decompressing the compressed test pattern comprises generating one or more bits of the decompressed pattern by logically combining two or more bits of the compressed test pattern.

17. The method of claim 16, wherein logically combining two or more bits of the compressed test pattern comprises combining the bits with an XOR operation.

18. The method of claim 13, wherein the compressed test pattern is a deterministic test pattern.

19. The method of claim 13, wherein the providing and decompressing occur within the circuit-under-test.

20. A method for applying test patterns to scan chains in a circuit-under-test, the method comprising:
providing a compressed test pattern of bits;
decompressing the compressed test pattern into a decompressed test pattern of bits as the compressed test pattern is being provided; and
applying the decompressed test pattern to scan chains of the circuit-under-test,
wherein applying the decompressed test pattern to the scan chains comprises applying during a time period a greater number of decompressed test pattern bits to the scan chains than the number of compressed test pattern provided during the same time period.

21. The method of claim 20, wherein decompressing the compressed test pattern comprises generating one or more bits of the decompressed pattern by logically combining two or more bits of the compressed test pattern.

22. The method of claim 21, wherein logically combining two or more bits of the compressed test pattern comprises combining the bits with an XOR operation.

23. The method of claim 20, wherein the compressed test pattern is a deterministic test pattern.

24. The method of claim 20, wherein the providing and decompressing occur within the circuit-under-test.

25. A circuit comprising:
a decompressor adapted to receive a compressed test pattern of bits and decompress the test pattern into a decompressed test pattern of bits as the compressed test pattern is being received;
circuit logic; and
scan chains for testing the circuit logic, the scan chains coupled to the decompressor and adapted to receive the decompressed test pattern,
wherein the decompressor comprises a linear finite state machine adapted to receive the compressed test pattern, wherein the decompressor includes a phase shifter coupled between the linear finite state machine and the scan chains, and wherein the phase shifter comprises an array of XNOR gates.

26. A method for applying test patterns to scan chains in a circuit-under-test, the method comprising:
providing a compressed test pattern of bits;
decompressing the compressed test pattern into a decompressed test pattern of bits as the compressed test pattern is being provided;
applying the decompressed test pattern to scan chains of the circuit-under-test; and
loading an intermediate register with the compressed test pattern, the intermediate register positioned between a decompressor, which is performing the decompressing, and automated test equipment which is providing the compressed test pattern.

27. A circuit comprising:
a decompressor adapted to receive a compressed test pattern of bits and decompress the test pattern into a decompressed test pattern of bits as the compressed test pattern is being received;
circuit logic;
scan chains for testing the circuit logic, the scan chains coupled to the decompressor and adapted to receive the decompressed test pattern; and
automated test equipment coupled externally to the circuit and an intermediate register coupled between the automated test equipment and the decompressor.

28. The circuit of claim 27, wherein the intermediate register receives compressed test patterns from the automated test equipment and provides the compressed test patterns to the decompressor.

29. A circuit comprising:
a decompressor adapted to receive a compressed test pattern of bits and decompress the test pattern into a decompressed test pattern of bits, the decompressor having a plurality of input channels and a plurality of outputs, the input channels receiving in parallel the bits of the compressed test pattern;
circuit logic;
scan chains for testing the circuit logic, the scan chains coupled to the outputs of the decompressor and adapted to receive the decompressed test pattern in parallel; and
automated test equipment coupled externally to the circuit and an intermediate register positioned between the automated test equipment and the decompressor.

30. A circuit comprising:
a linear finite state machine having input logic gates adapted to logically combine bits stored within the machine with bits received from a compressed test pattern, the state machine generating therefrom a series of bits;
a phase shifter coupled to the linear finite state machine, the phase shifter adapted to logically combine two or more bits generated by the linear finite state machine to produce a decompressed pattern of bits;
scan chains coupled to the phase shifter and adapted to receive therefrom the decompressed test pattern; and
automated test equipment coupled externally to the circuit and an intermediate register positioned between the automated test equipment and the linear finite state machine.

31. A circuit comprising:
a linear finite state machine having input logic gates adapted to logically combine bits stored within the machine with bits received from a compressed test pattern, the state machine generating therefrom a series of bits;
a phase shifter coupled to the linear finite state machine, the phase shifter adapted to logically combine two or more bits generated by the linear finite state machine to produce a decompressed pattern of bits; and
scan chains coupled to the phase shifter and adapted to receive therefrom the decompressed test pattern,
wherein the bits of the compressed test pattern are received while the decompressed pattern of bits are produced.

32. The circuit of claim 31, wherein the number of scan chains is greater than the number of input channels.

33. A circuit comprising:
a linear finite state machine having input logic gates adapted to logically combine bits stored within the machine with bits received from a compressed test pattern, the state machine generating therefrom a series of bits;
a phase shifter coupled to the linear finite state machine, the phase shifter adapted to logically combine two or more bits generated by the linear finite state machine to produce a decompressed pattern of bits; and
scan chains coupled to the phase shifter and adapted to receive therefrom the decompressed test pattern,
wherein the linear state machine receives bits of the compressed test pattern substantially concurrent with the phase shifter producing a decompressed pattern of bits.

34. The circuit of claim 33, wherein the number of scan chains is greater than the number of input channels.

35. A method for applying test patterns to scan chains in a circuit-under-test, the method comprising:
providing a compressed test pattern of bits;
decompressing the compressed test pattern into a decompressed test pattern of bits as the compressed test pattern is being provided; and
applying the decompressed test pattern to scan chains of the circuit-under-test,
wherein providing the compressed test pattern, decompressing the compressed test pattern, and applying the decompressed pattern are performed synchronously at a same clock rate, and wherein decompressing the compressed test pattern comprises generating one or more bits of the decompressed pattern by logically combining two or more bits of the compressed test pattern.

36. The method of claim 35, wherein logically combining two or more bits of the compressed test pattern comprises combining the bits with an XOR operation.

37. A method for applying test patterns to scan chains in a circuit-under-test, the method comprising:
providing a compressed test pattern of bits;
decompressing the compressed test pattern into a decompressed test pattern of bits as the compressed test pattern is being provided; and
applying the decompressed test pattern to scan chains of the circuit-under-test,
wherein providing the compressed test pattern, decompressing the compressed test pattern, and applying the decompressed pattern are performed synchronously at a same clock rate, and wherein the compressed test pattern is a deterministic test pattern.

* * * * *